(12) United States Patent
Patel et al.

(10) Patent No.: US 9,825,406 B2
(45) Date of Patent: Nov. 21, 2017

(54) METHODS OF MANUFACTURE OF COMMUNICATION CONNECTORS AND COMMUNICATION CONNECTOR CIRCUITS

(71) Applicant: Panduit Corp., Tinley Park, IL (US)

(72) Inventors: Satish I. Patel, Roselle, IL (US);
Robert E. Fransen, Tinley Park, IL (US); Frank M. Straka, Orland Park, IL (US); Melanie M. Hagar, Bartlett, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/820,652

(22) Filed: Aug. 7, 2015

(65) Prior Publication Data

US 2015/0349463 A1    Dec. 3, 2015

Related U.S. Application Data

(63) Continuation of application No. 14/170,988, filed on Feb. 3, 2014, now Pat. No. 9,106,021, which is a continuation of application No. 13/425,130, filed on Mar. 20, 2012, now Pat. No. 8,641,452.

(60) Provisional application No. 61/466,201, filed on Mar. 22, 2011.

(51) Int. Cl.

| | |
|---|---|
| *H05K 7/06* | (2006.01) |
| *H01R 13/6464* | (2011.01) |
| *H01R 24/58* | (2011.01) |
| *H01R 43/20* | (2006.01) |
| *H01R 13/6466* | (2011.01) |
| *H01R 13/66* | (2006.01) |
| *H01R 24/64* | (2011.01) |

(Continued)

(52) U.S. Cl.
CPC ..... *H01R 13/6464* (2013.01); *H01R 13/6461* (2013.01); *H01R 13/6466* (2013.01); *H01R 13/6658* (2013.01); *H01R 24/58* (2013.01); *H01R 24/64* (2013.01); *H01R 43/205* (2013.01); *H05K 1/0228* (2013.01); *H05K 1/0239* (2013.01); *Y10T 29/4913* (2015.01); *Y10T 29/49224* (2015.01)

(58) Field of Classification Search
CPC ............ H01R 13/6461; H01R 13/6464; H01R 13/6466; H01R 13/6658; H01R 24/58; H01R 24/64
See application file for complete search history.

(56) References Cited

U.S. PATENT DOCUMENTS

| | | |
|---|---|---|
| 2,476,886 A | 7/1949 | Miller et al. |
| 3,949,180 A | 4/1976 | Ojima et al. |
| 4,080,027 A | 3/1978 | Benasutti |

(Continued)

FOREIGN PATENT DOCUMENTS

| | | |
|---|---|---|
| EP | 0645843 A2 | 3/1995 |
| WO | 2008060272 A1 | 5/2008 |
| WO | 2008076813 A2 | 6/2008 |

*Primary Examiner* — Minh Trinh
(74) *Attorney, Agent, or Firm* — Christopher S. Clancy; James H. Williams; Christopher K. Marlow

(57) ABSTRACT

Embodiments of the present invention generally relate to communication connectors, and methods of manufacture thereof and their components. In some embodiments, the methods focus on reducing the net effect on electrical performance of communication connectors from variation in manufacturing, where the connectors include multiple stages of capacitive coupling.

3 Claims, 43 Drawing Sheets

(51) Int. Cl.
*H01R 13/6461* (2011.01)
*H05K 1/02* (2006.01)

(56) References Cited

U.S. PATENT DOCUMENTS

| | | |
|---|---|---|
| 4,274,691 A | 6/1981 | Abernethy et al. |
| 4,662,702 A | 5/1987 | Furuya |
| 5,163,835 A | 11/1992 | Morlion et al. |
| 5,224,884 A | 7/1993 | Singer et al. |
| 5,230,632 A | 7/1993 | Baumberger et al. |
| 5,240,420 A | 8/1993 | Roberts |
| 5,716,237 A | 2/1998 | Conorich et al. |
| 5,788,515 A | 8/1998 | Mitra et al. |
| 5,997,358 A * | 12/1999 | Adriaenssens ....... H05K 1/0228 439/395 |
| 6,010,367 A | 1/2000 | Wu |
| 6,089,923 A | 7/2000 | Phommachanh |
| 6,106,335 A | 8/2000 | Merchant et al. |
| 6,139,371 A * | 10/2000 | Troutman .......... H01R 13/6464 439/676 |
| 6,176,742 B1 | 1/2001 | Arnett et al. |
| 6,360,437 B1 | 3/2002 | Fukumoto et al. |
| 6,767,257 B2 | 7/2004 | Arnett et al. |
| 7,125,288 B2 | 10/2006 | Schilling |
| 7,294,025 B1 | 11/2007 | Chen |
| 7,367,849 B2 | 5/2008 | Wang et al. |
| RE41,699 E | 9/2010 | Itano et al. |
| 8,425,255 B2 | 4/2013 | Erickson et al. |
| 8,641,452 B2 * | 2/2014 | Patel .................. H01R 13/6466 439/620.23 |
| 9,246,274 B2 * | 1/2016 | Valenti .............. H01R 13/6466 |
| 2004/0184247 A1 * | 9/2004 | Adriaenssens ....... H05K 1/0228 361/766 |
| 2009/0275236 A1 * | 11/2009 | Murray ................ H05K 1/0228 439/620.21 |
| 2010/0197162 A1 * | 8/2010 | Straka .................. H01R 13/516 439/404 |
| 2012/0052734 A1 | 3/2012 | Fukuda et al. |

\* cited by examiner

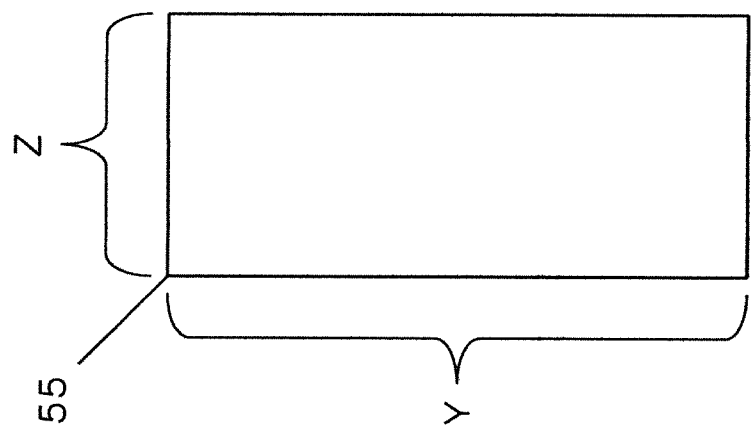
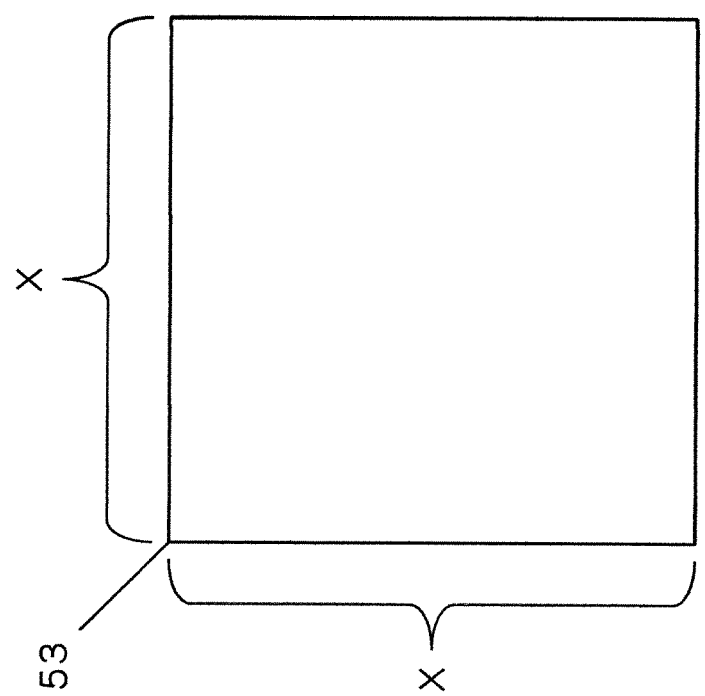
FIG.16

| Soldermask | 1.2 mil | |
|---|---|---|
| Plated 1 oz copper | 2.1 mil | Top Layer |
| Prepreg | 25 mil | |
| 0.5 oz copper | 0.7 mil | Inner Layer 1 |
| 4 mil core | 4 mil | |
| 0.5 oz copper | 0.7 mil | Inner Layer 2 |
| Prepreg | 25 mil | |
| Plated 1 oz copper | 2.1 mil | Bottom Layer |
| Soldermask | 1.2 mil | |
| TOTAL THICKNESS: | 62 | |

Previous 4-layer stack-up. Capacitors are formed between inner layer 1 and 2.

| Soldermask | 1.2 mil | |
|---|---|---|
| Plated 1 oz copper | 2.1 mil | Top Layer |
| Prepreg | 25 mil | |
| 1 oz copper | 1.4 mil | Inner Layer 1 |
| 4 mil core | 4 mil | |
| 1 oz copper | 1.4 mil | Inner Layer 1 |
| Prepreg | 25 mil | |
| Plated 1 oz copper | 2.1 mil | Bottom Layer |
| Soldermask | 1.2 mil | |
| TOTAL THICKNESS: | 63.4 | |

4-layer stack-up used for horizontal rigid board 60A. Note that now capacitors are formed between the top layer and inner layer 1, in addition to the bottom layer and inner layer 2.

| Soldermask | 1.2 mil | |
|---|---|---|
| Plated 1 oz copper | 2.1 mil | Top Layer |
| Core | 55.4 mil | |
| Plated 1 oz copper | 2.1 mil | Bottom Layer |
| Soldermask | 1.2 mil | |
| TOTAL THICKNESS: | 62 | |

2-layer stack-up used for the vertical board 50A. Since no capacitors are on it, a 2-layer design was used for cost savings.

FIG.37

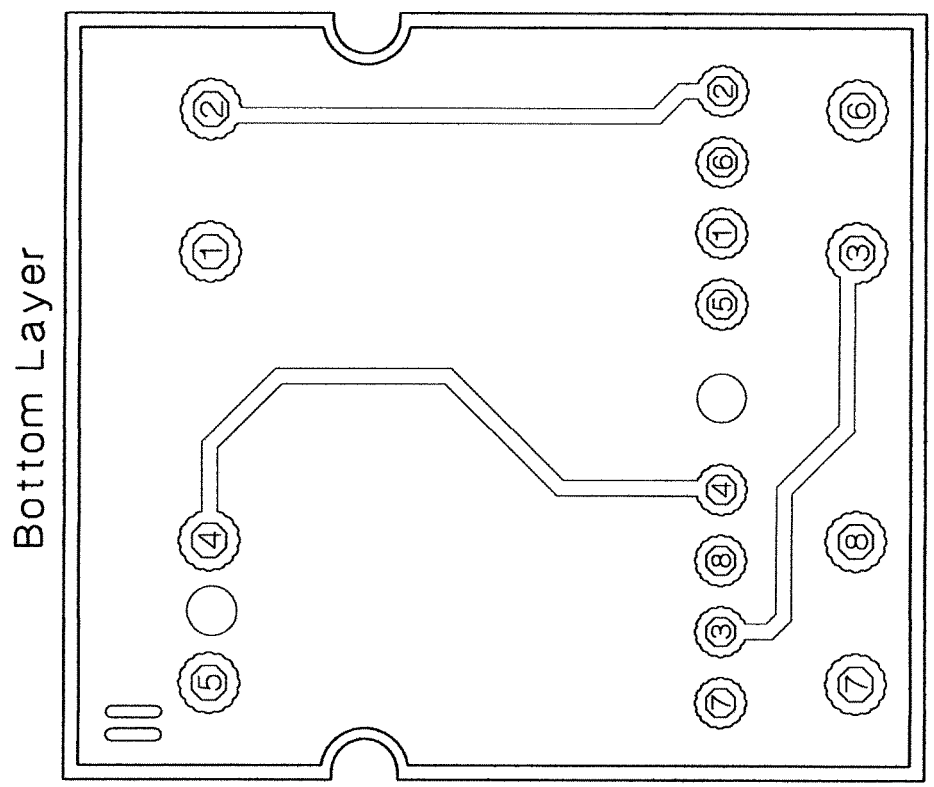
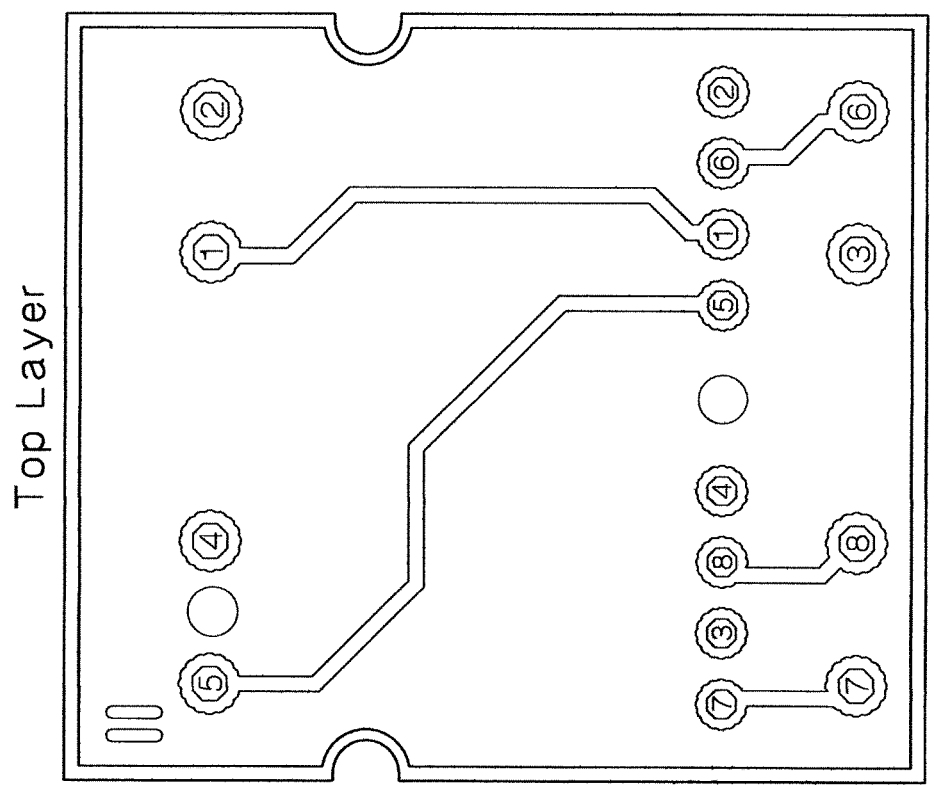
FIG. 42

METHODS OF MANUFACTURE OF COMMUNICATION CONNECTORS AND COMMUNICATION CONNECTOR CIRCUITS

CROSS-REFERENCE TO RELATED APPLICATIONS

This application is a continuation of U.S. application Ser. No. 14/170,988, filed Feb. 3, 2014, which will issue as U.S. Pat. No. 9,106,021 on Aug. 11, 2015, which is a continuation of U.S. application Ser. No. 13/425,130, filed Mar. 20, 2012, which issued as U.S. Pat. No. 8,641,452 on Feb. 4, 2014, and claims priority to U.S. Provisional Application Ser. No. 61/466,201, filed Mar. 22, 2011, the entire disclosure of which are hereby incorporated by reference.

FIELD OF THE INVENTION

The present invention relates generally to a communication connector, and more particularly to a communication jack.

BACKGROUND OF THE INVENTION

In an electrical communication system, it is sometimes advantageous to transmit data in the form of differential signals over a pair of conductive paths (i.e., a conductive path pair) rather than a single conductive path, where the transmitted signal comprises the voltage difference between the conductive paths without regard to the absolute voltages present. Each conductive path in a conductive path pair is capable of picking up electrical noise from outside sources, e.g., neighboring data lines, or other sources. Differential signals may be advantageous to use due to the fact that the signals are less susceptible to these outside sources.

A concern with differential signals is electrical noise that is caused by neighboring differential conductive path pairs, where the individual conductors on each conductive path pair couple (inductively or capacitively) in an unequal manner that results in added noise to the neighboring conductive path pair. This is referred to as crosstalk.

The ability of a data connector to support higher bandwidths depends, at least in part, on the amount of crosstalk that it adds to the system. Ideally, the connector should be transparent to the system, meaning it should not add any crosstalk to the system. For systems using RJ45 style connectors, as are known in the art, crosstalk is inherent to the conductor pair layout. For this type of connector, crosstalk reduction and suppression become critical. Some of the crosstalk reduction efforts focus on isolation, minimizing capacitive and inductive imbalances, and reducing the overall path length of conductors within the connector.

FIGS. 1-3 provide an overview of a known RJ45 style connector. FIG. 1 depicts a connector 2 shown comprising a known communication jack 4 and a communication plug 6 in a connected position, although both communication jack 4 and communication plug 6 can separately each be considered a connector. FIG. 2 depicts the known communication jack 4, which is shown comprising plug interface contacts (PICs) 10, and FIG. 3 depicts the communication plug 6, which is shown comprising plug contacts 12.

RJ45 connector parameters are defined by the ANSI/TIA-568-C.2 standard, and noise suppression typically takes place inside the communication jack 4 of the connector 2. The effectiveness of the suppression depends in part on (i) the distance from the plug contacts 12 on the communication plug 6 and the PICs 10 on the communication jack 4 to the compensation elements in the communication jack 4, and (ii) inductive and capacitive balance.

For interoperability and long term reliability, the communication jack 4 is also required to meet stringent physical and mechanical requirements, such as certain contact angles, normal force, and insertion cycles relative to the PICs 10 on the communication jack 4. Crosstalk suppression favors a shorter contact length, yet the mechanical requirements often require longer contacts than can be readily used for crosstalk suppression. In most cases, the length required to meet the mechanical requirements is a limiting factor. Hence, it becomes beneficial for higher bandwidth connectors to have PICs that meet mechanical requirements while remaining short enough to enable effective crosstalk suppression.

An exploded perspective illustration of one type of communication jack 4 is depicted in FIG. 4. The communication jack 4 is shown comprising a housing 14 that fits an RJ45 communication plug, a nose 16, a rigid printed circuit board (PCB) 18 connected to insulation displacement contacts (IDCs) 20, a rear sled 22 that holds the IDCs 20, and a wire cap 24 that assists wires within cabling to connect to the IDCs 20. The nose 16 may sit within the housing 14 and provides an interface between the plug contacts and the rigid PCB 18. In this respect, as shown, the nose 16 comprises eight PICs 28 that each mate with a respective plug contact on the communication plug (not shown) on a contact surface and with a through hole on the rigid PCB 18 at an end. As shown, the PICs 28 wrap around a mandrel 34 on the nose 16. The PICs 28 may be supported in the nose 16 by a front bottom sled 30 and a front top sled 32, each mechanically coupled to the PICs 28.

The nose 16 may also include a flexible PCB 26 that provides crosstalk compensation when the flexible PCB 26 is in contact with the PICs 28. As shown, the flexible PCB 26 wraps around the same mandrel 34 as the PICs 28, and includes conductive traces on at least one side and/or layer that facilitate electrical contact with the PICs 28.

The interaction of the communication jack 4 and communication plug 6 may be seen in FIG. 5. In the communication jack 4, the PICs 28 operate dually as electrical contacts and mechanical springs. However, as discussed above, the electrical and mechanical functions of the PICs 28 are somewhat opposed. The PICs 28 are designed to maintain a contact normal force of about 100 grams on the plug contacts 12 in the communication plug in the window of movement. However, the mechanical length necessary to achieve this contact normal force may be detrimental to electrical performance due to inductive and capacitive coupling between a given PIC 28 and other PICs 28, as increased PIC length results in increased coupling.

FIG. 5 shows a first contact point 38, marking the contact between the individual plug contacts 12 and the PICs 28, and a second contact point 40, marking the contact between the PICs 28 and the flexible PCB 26. The distance 36 between the first contact point 38 and the second contact point 40 is smaller than on a typical communication jack that does not utilize a flexible PCB 26. The shorter distance 36 increases the effectiveness of crosstalk compensation in the flexible PCB 26.

However, while the communication jack of FIGS. 1-5 provides some improvement in crosstalk suppression, the design also is subject to potential difficulties. First, the flexible PCB 26 costs more than the standard rigid PCB 18. Additionally, due to the small size and low weight of the flexible PCB 26 there can be difficulties in handling during manufacturing.

Thus, manufacture of the circuit board components for communication jack 4 requires two different manufacturing processes for the flexible PCB 26 and the rigid PCB 18. In some cases, these processes can have etching tolerances at opposite ends of the tolerance spectrum. Such mismatch along the tolerance spectrum results in a mismatch in the balancing capacitors located on the flexible PCB 26 and the rigid PCB 18. The unbalanced capacitors will fail to cancel the crosstalk effectively and will yield a connector with poor performance. The limitations and complexity of the manufacture of the communication jack 4 may additionally require that the section of the PICs 28 from the sled mandrel 34 to the rigid PCB 18 be routed in a particular way that may add to coupling within the connector as well as between adjacent connectors. In order to reduce coupled crosstalk between the connectors, spacing must be increased between the connectors, or foil wrap must be added around the connector. The increased spacing reduces the number of connectors in a given space and addition of the foil increases the connector cost.

SUMMARY OF THE INVENTION

The present invention comprises, in at least one embodiment thereof, a communication jack which includes a housing with an aperture for receiving a communication plug, and a circuit board at least partially within the housing. The circuit board includes crosstalk compensation elements. A plurality of plug interface contacts are connected to the circuit board. At least one of the plurality of plug interface contacts includes a contact element layered with at least one spring element.

The present invention comprises, in another embodiment thereof, a communication system including electrical equipment connected to at least one communication jack. The jack includes a housing with an aperture for receiving a communication plug, and a circuit board at least partially within the housing. The circuit board includes crosstalk compensation elements. A plurality of plug interface contacts are connected to the circuit board. At least one of the plurality of plug interface contacts includes a contact element layered with at least one spring element.

The present invention comprises, in another embodiment thereof, a communication jack for compensating a source of crosstalk in a mated communication plug over a range of signal operating frequencies. The jack includes a plurality of plug interface contacts (PICs), where each PIC comprises a spring element, a contact element pivotally connected to the spring element, and an electrically insulating element, wherein the electrically insulating element connects the contact element to the spring element.

The present invention comprises, in another embodiment thereof, a communication system which includes an electrical equipment and a communication jack connected to the electrical equipment. The jack includes a plurality of plug interface contacts (PICs), where each PIC comprises a spring element, a contact element pivotally connected to the spring element, and an electrically insulating element, wherein the electrically insulating element connects the contact element to the spring element.

The present invention comprises, in another embodiment thereof, a communication jack for compensating a source of crosstalk in a mated communication plug over a range of signal operating frequencies, which includes a plurality of plug interface contacts (PICs). Each PIC has a spring element, an electrically insulating element, and a contact element. The contact element has a free end and a spring end, and the electrically insulating element is connected between the spring element and the spring end of the contact element.

The present invention comprises, in another embodiment thereof, a communication system which includes an electrical equipment and a communication jack connected to the electrical equipment. The jack includes a plurality of plug interface contacts (PICs). Each PIC has a spring element, an electrically insulating element, and a contact element. The contact element has a free end and a spring end, and the electrically insulating element is connected between the spring element and the spring end of the contact element.

The present invention comprises, in another embodiment thereof, a method of manufacturing a communication jack for compensating a source of crosstalk in a mated communication plug over a range of signal operating frequencies. The method includes the steps of providing a printed circuit board comprising one or more crosstalk compensation circuits; and contacting a plug interface contact (PIC) to a contact on the printed circuit board, wherein the PIC comprises: a spring element, a contact element pivotally connected to the spring element, and an electrically insulating element, wherein the electrically insulating element connects the contact element to the spring element.

The present invention comprises, in another embodiment thereof, a communication jack, which includes at least one printed circuit board having a plurality of conductors arranged in respective signal pairs, wherein the at least one printed circuit board is subjected to a manufacturing variation. A first stage of at least one first capacitor is connected between one of the plurality of conductors for a first signal pair of the signal pairs and another of the plurality of conductors for a second signal pair of the signal pairs. A second stage includes at least one second capacitor of an opposite polarity of the first capacitor(s), where the second capacitor(s) is/are connected between the first signal pair and the second signal pair. At least one second capacitor includes a geometry that is chosen such that a net capacitance of the first stage and the second stage is minimized in the presence of the manufacturing variation.

The present invention comprises, in another embodiment thereof, a method of designing a communication jack. The method comprises the steps of: providing a circuit board at least partially within a jack housing and having a first stage of capacitors and a second stage of capacitors for at least partially improving an electrical performance of the jack; optimizing the first stage of capacitors and the second stage of capacitors for the electrical performance; and compensating for the effect of a manufacturing variation of the circuit board to minimize the effect of the manufacturing variation on the electrical performance.

An advantage of at least one embodiment of the present invention is a communication jack with a shorter electrical length between the point of contact with mating plug contacts and the first compensation stage in the jack.

Another advantage of at least one embodiment of the present invention is a communication jack with shorter PIC lengths thereby reducing the jack susceptibility to crosstalk.

Yet another advantage of at least one embodiment of the present invention is a communication jack that has improved electrical performance and is relatively cost effective to manufacture.

Yet another advantage of at least one embodiment of the present invention is a communication jack that reduces the effect of manufacturing variation on electrical performance.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIGS. 13A-17 are various views of an embodiment of two rigid PCBs which can be used in a communication jack according to the present invention;

FIGS. 37-43 are various views of another embodiment of two rigid PCBs which can be used in a communication jack according to the present invention.

Corresponding reference characters indicate corresponding parts throughout the several views. The exemplification set out herein illustrates preferred embodiments of the invention, in one form, and such exemplification is not to be construed as limiting the scope of the invention in any manner.

DETAILED DESCRIPTION OF THE ILLUSTRATED EMBODIMENTS

Figure 6:
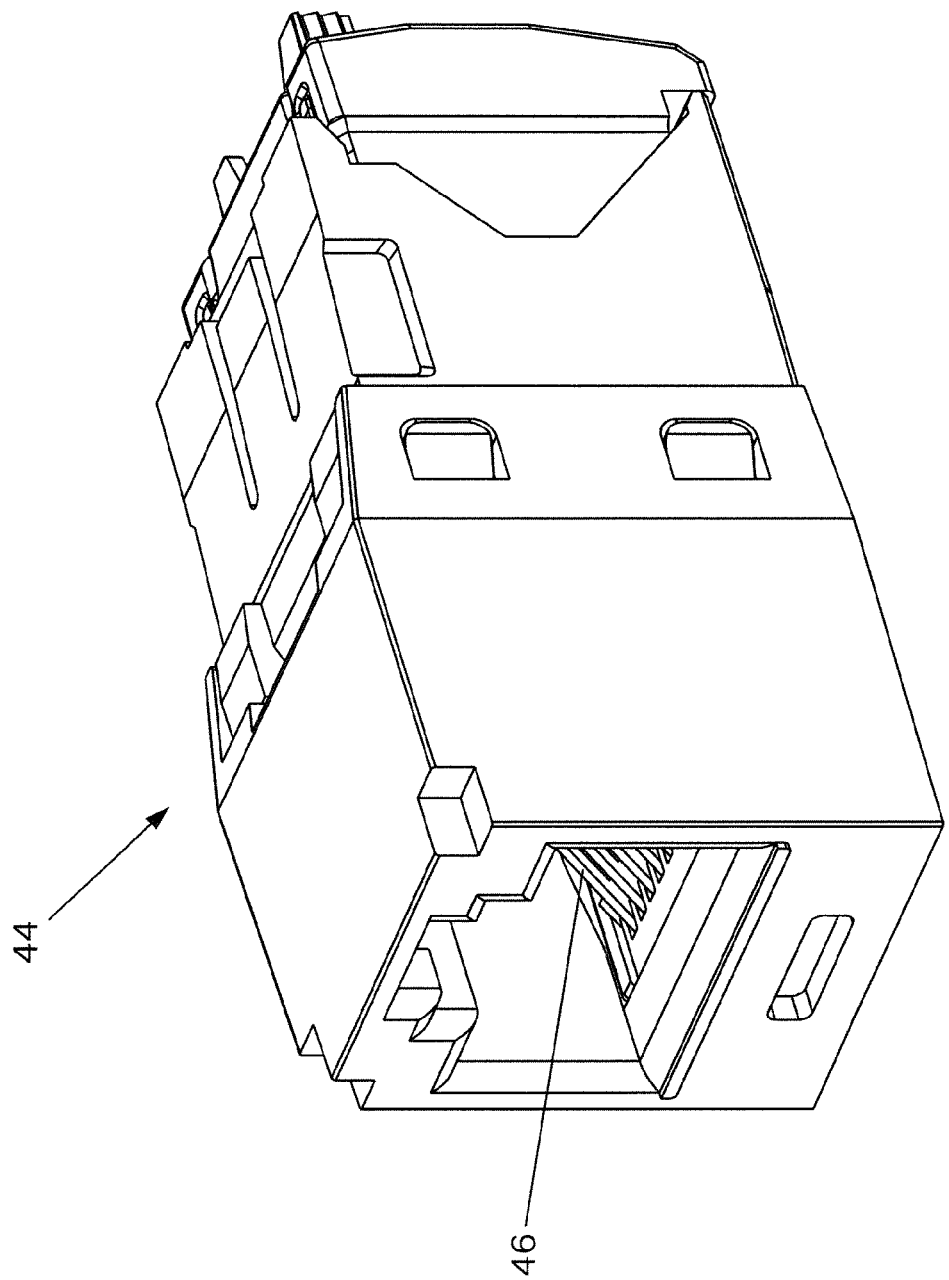
FIG. 6 is a perspective view of a communication jack in accordance with an embodiment of the present invention.
Figure 7:
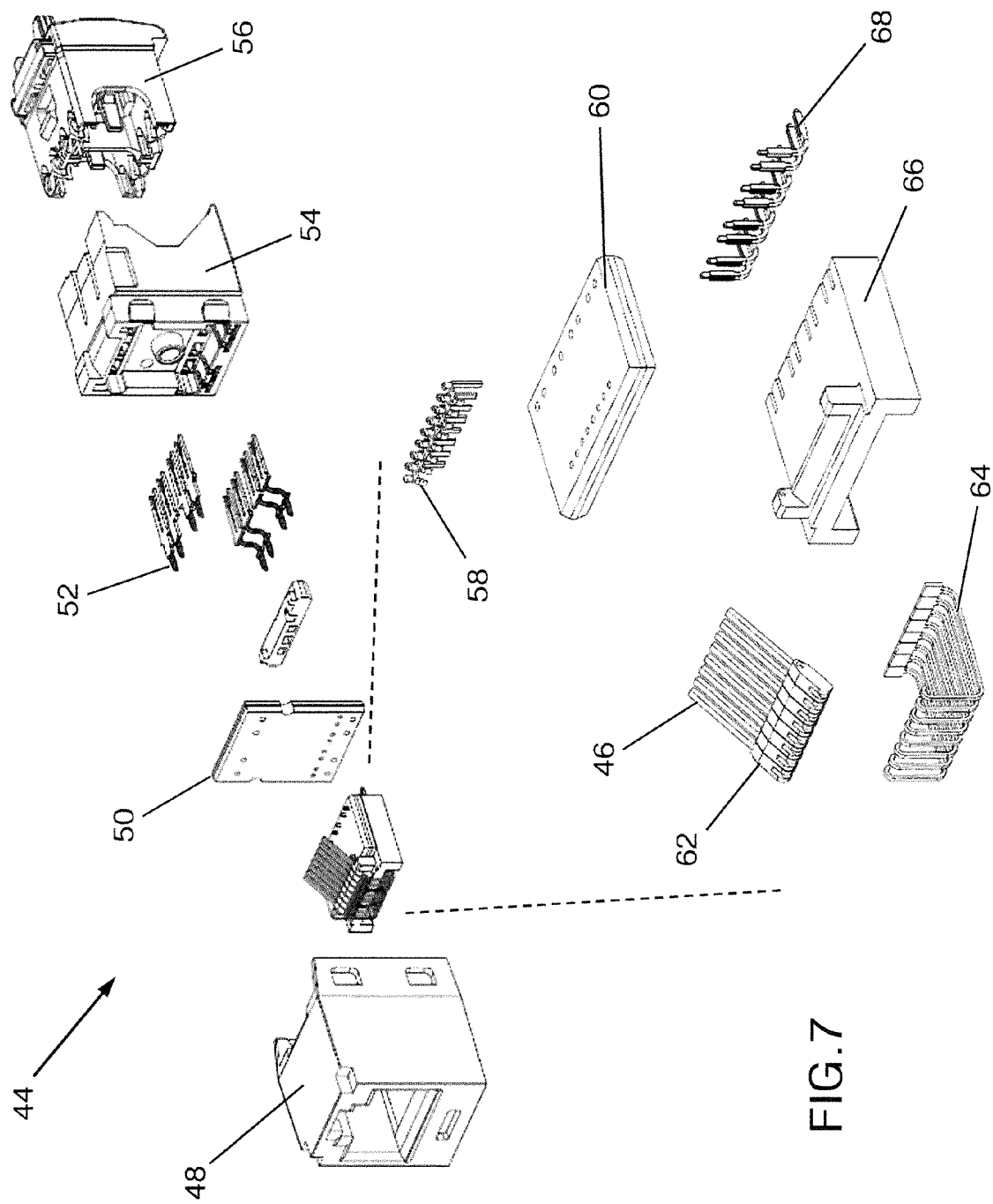
FIG. 7 is an exploded perspective view of the communication jack of FIG. 6.

FIG. 6 depicts a communication jack in accordance with an embodiment of the present invention. The communication jack 44 can include PICs. The PICs are made up of contact elements 46, electrically insulating elements 62, and mechanical spring elements 64 as shown in FIG. 7. Each of the elements will be described in further detail below. As described above with respect to background embodiments, the PICs serve to mate with plug contacts on a communication plug (not shown). In particular, the contact elements 46 of the PICs serve to mate with the plug contacts.

An exploded perspective illustration of the communication jack 44 is shown in FIG. 7. The communication jack 44 is shown comprising a housing 48, a vertical rigid PCB 50, insulation displacement contacts (IDCs) 52, a rear sled 54, a wire cap 56, and the PICs. The contact elements 46 of the PICs are operable to contact with respective plug contacts (not shown) as well as with a horizontal rigid PCB 60 by way of through contacts 58. The through contacts 58 are made of a conductive material, such as a copper alloy. While the communication jack 44 is shown comprising eight PICs, more or fewer PICs are possible.

As described above. PICs in the communication jack 44 have both an electrical function and a mechanical function. The PICs optimize electrical functionality through the design of the contact elements 46. The contact elements 46 have shorter lengths relative to the PICs of typical communication jacks as described above. The shorter lengths of the contact elements 46 result in reduced coupling between the contacts, as described above.

However, for the illustrated example, the PICs must also provide a requisite contact normal force of about 100 grams on the plug contacts in the window of movement. The contact normal force is necessary to have a low-resistance interface for the communication plug. The PICs have improved mechanical functionality through the design of the mechanical spring elements 64. The mechanical spring elements 64 provide the communication jack 44 the requisite contact normal force between the PICs and the contacts of the plug 12.

The tradeoff between the electrical and mechanical functionalities of the PICs is addressed through the use of the electrically insulating elements 62. The electrically insulating elements 62 connect the contact elements 46 to the mechanical spring elements 64. In this manner, the contact elements 46 are electrically insulated from the mechanical spring elements 64, meaning the mechanical spring elements 64 do not extend the electrical length of the PICs. Rather, only the contact elements 46 of the PICs operate as part of the electrical circuit in the communication jack 44. Thus, the communication jack 44 reduces crosstalk at the contacts while still providing the requisite contact normal force.

As mentioned above, the contact elements 46 of each PIC are connected to the mechanical spring elements 64 via the electrically insulating elements 62. In some embodiments, the contact elements may be pivotally connected to the mechanical spring elements 64. Thus, the spring elements 64 may be made of a conductive material but still will not extend the electrical length of the PIC. Alternatively, the spring elements 64 may be made of a non-conductive material such that the electrically insulating elements 62 may be omitted.

Figure 8:
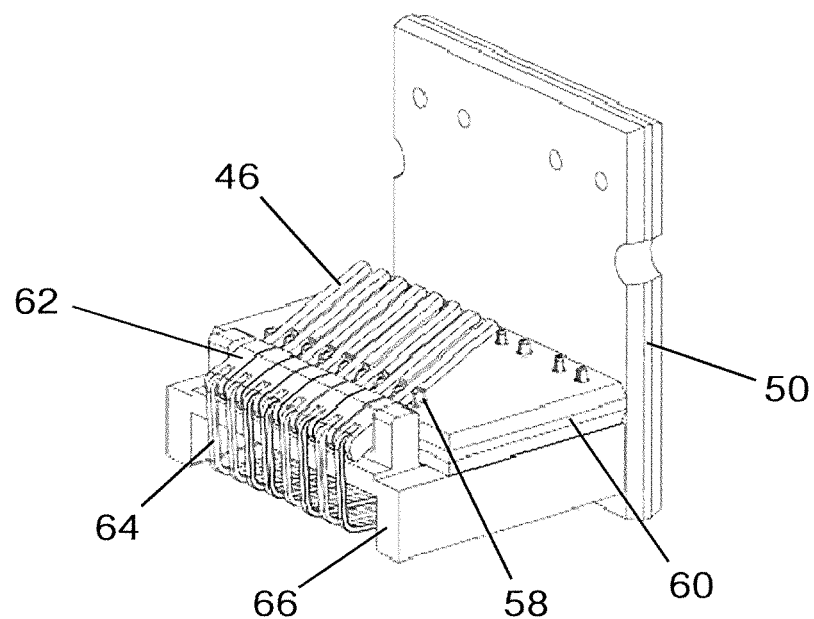
FIG. 8 is a perspective view of the front sled assembly of the jack of FIG. 6.
Figure 9:
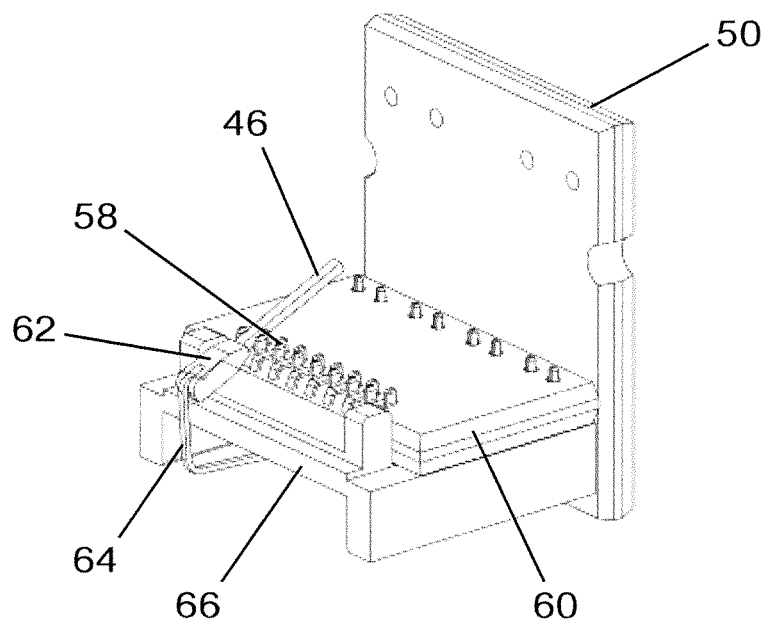
FIG. 9 is a fragmentary perspective view of the front sled assembly of the jack of FIG. 8.

FIGS. 8 and 9 depict portions of a communication jack in accordance with an embodiment of the present invention and are included to assist in illustrating the mechanical functionality of the communication jack 44. As shown in FIG. 8, the contact elements 46 of the PICs are each respectively connected to the mechanical spring elements 64 via the electrically insulating elements 62 and are supported by front sled 66. As a communication plug (not shown) is inserted into the communication jack 44, the contact elements 46 will act as levers, rotating around the front edge of the horizontal rigid PCB 60. The contact elements 46 will wipe with respective through contacts 58, establishing electrical connection with the horizontal rigid PCB 60. Additionally, the lever-like motion of the contact elements 46 will lift respective mechanical spring elements 64. The resistance of the mechanical spring elements 64 to the upward motion provides the contact normal force at the interface between the contact elements 46 and the plug contacts.

FIG. 9 is similar to FIG. 8, except that only one set of a contact element 46, electrically insulating element 62, and a mechanical spring element 64 is shown. FIG. 9 makes it easy to see how the lever-like motion of the contact element 46 would cause an upward force on the mechanical spring element 64. It can also be seen from FIG. 9 how the electrical length of the PIC is limited to the relatively short length of the contact element through the use of the electrically insulating element 62 to connect the contact element 46 and the mechanical spring element 64.

The contact elements 46 may be manufactured using non-spring materials. As the mechanical spring elements 64 are electrically isolated from the contact elements 46, the mechanical spring elements 64 may be made longer to withstand the displacement of the contact elements 46 over a range of plug-contact crimp heights, including four- and six-position plug insertion. As a result of the electrically insulating elements 62, such an increase in the length of the mechanical spring elements 64 does not increase the electrical length of the PIC as a whole. This electrical isolation further essentially eliminates inductive and capacitive coupling between the mechanical spring elements 64 themselves.

Figure 1:
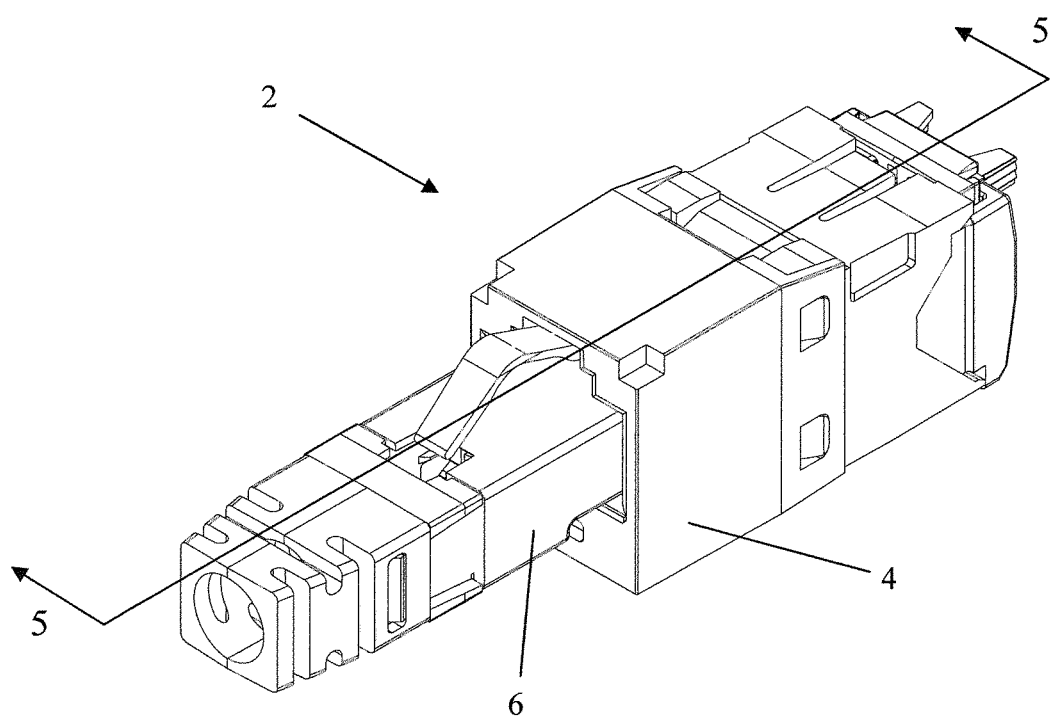
FIG. 1 is a perspective view of a communication connector including a communication jack with a mated communication plug.
Figure 2:
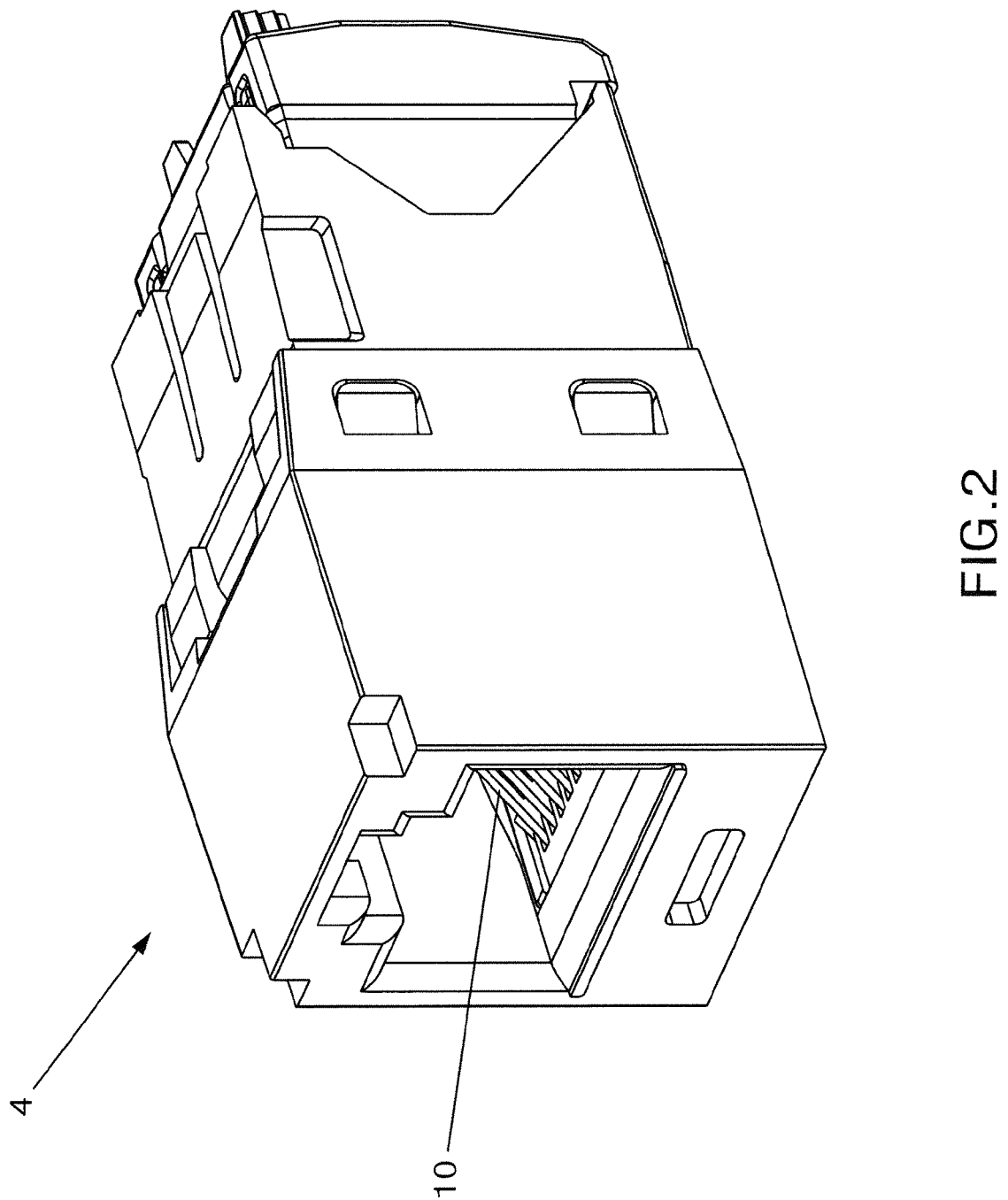
FIG. 2 is a perspective view of the communication jack of FIG. 1.
Figure 3:
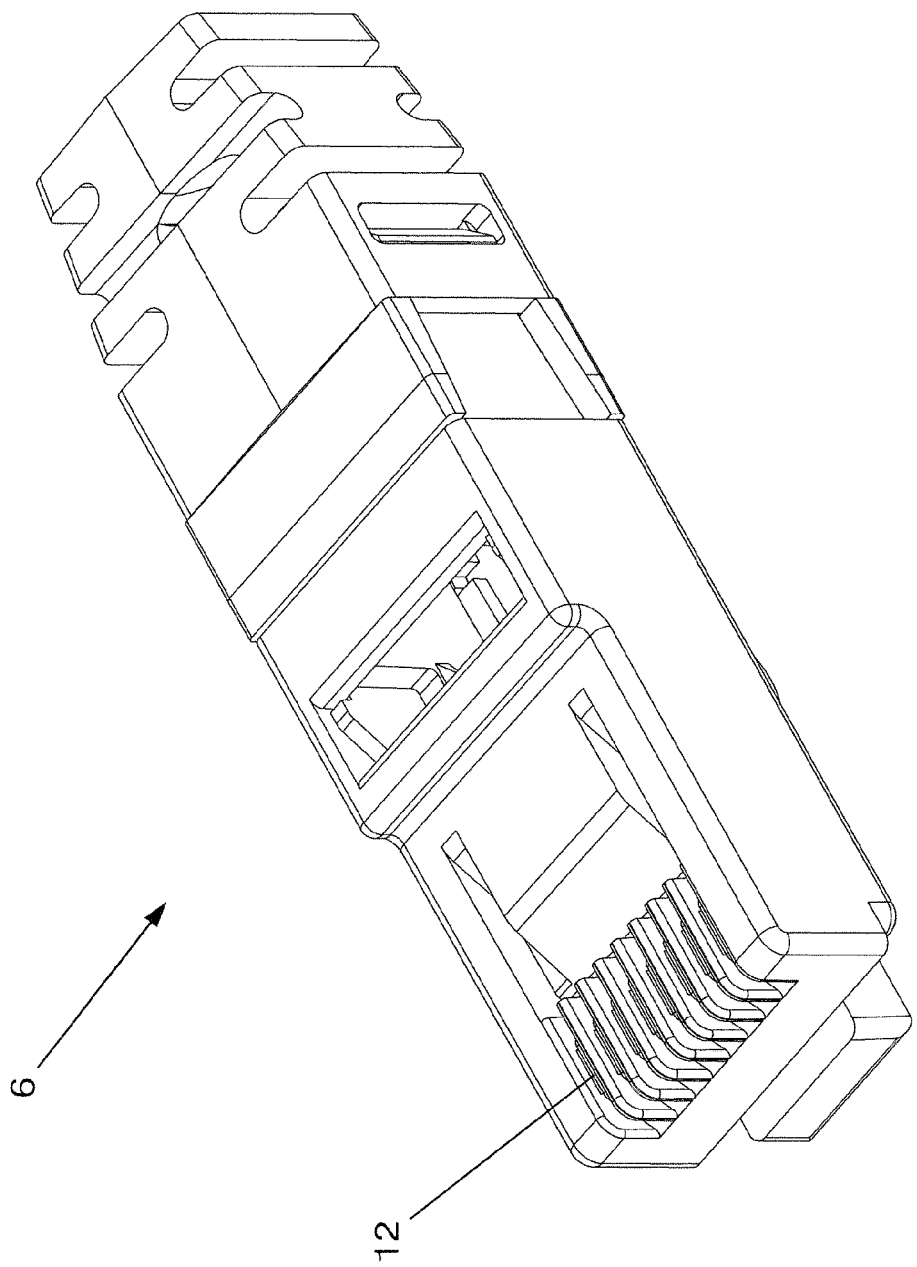
FIG. 3 is a perspective view of the communication plug of FIG. 1.
Figure 4:
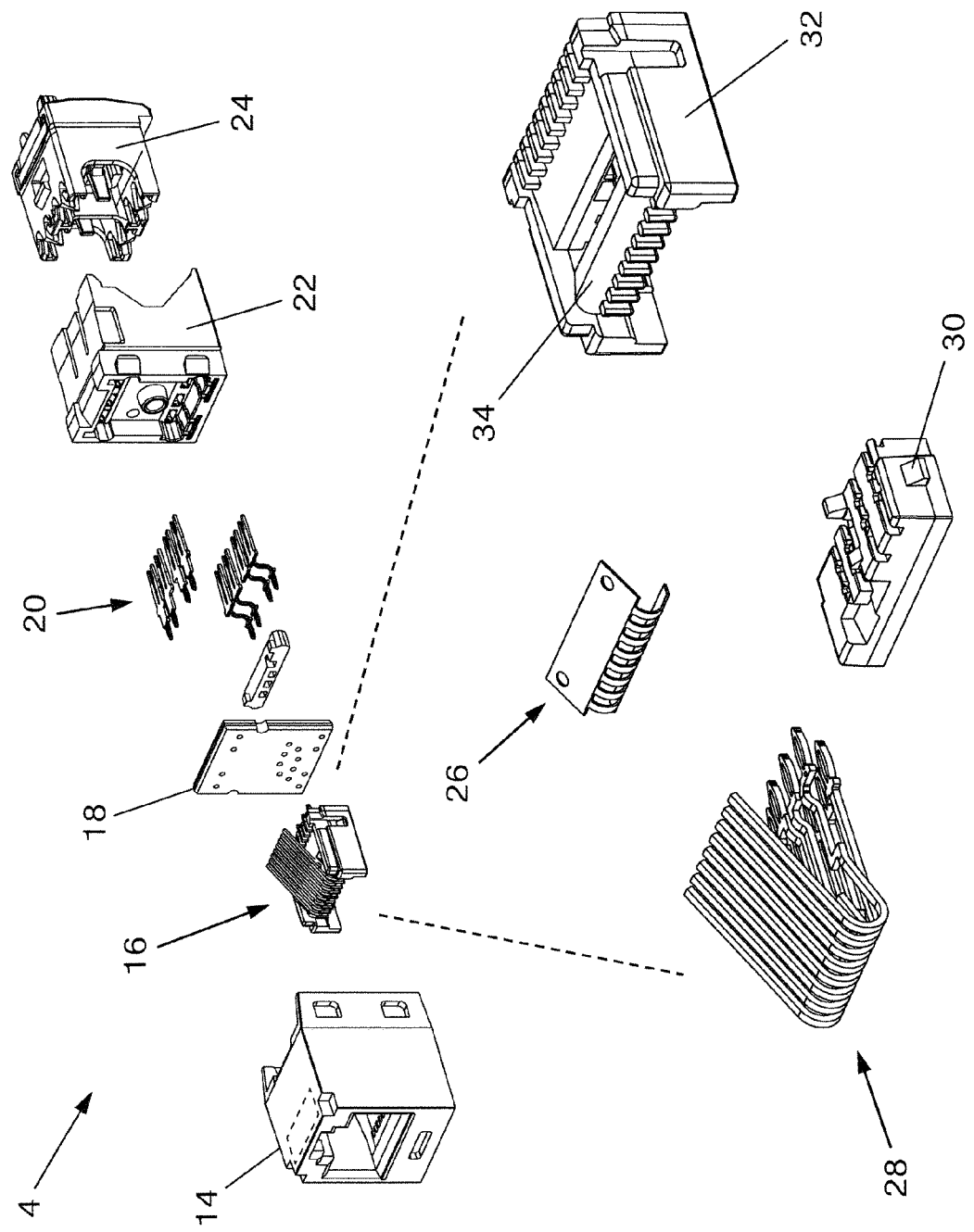
FIG. 4 is an exploded perspective view of the communication jack of FIGS. 1 and 2.
Figure 5:
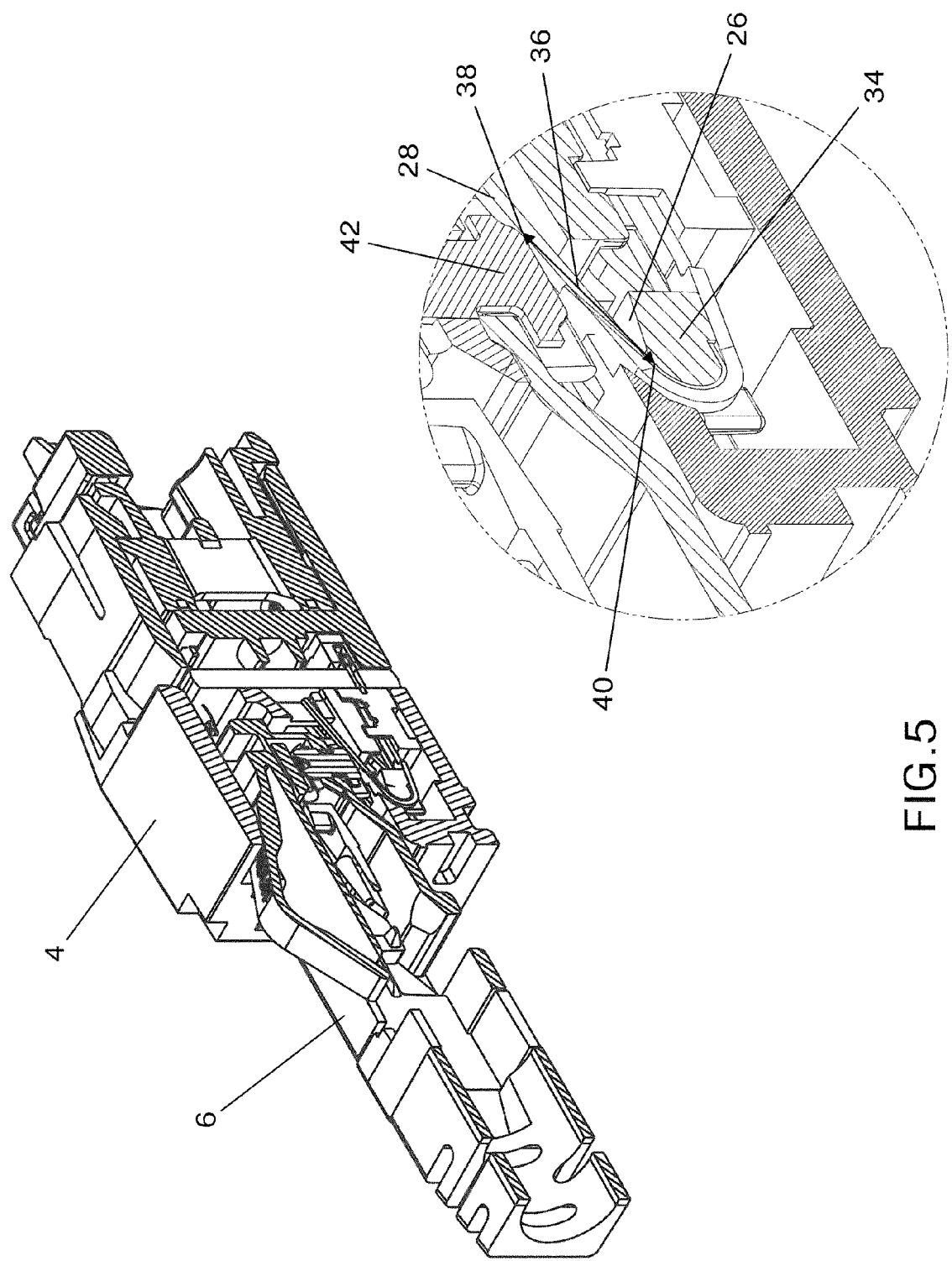
FIG. 5 is a cross-sectional view of the communication connector of FIG. 1 taken along section line 5-5.
Figure 11:
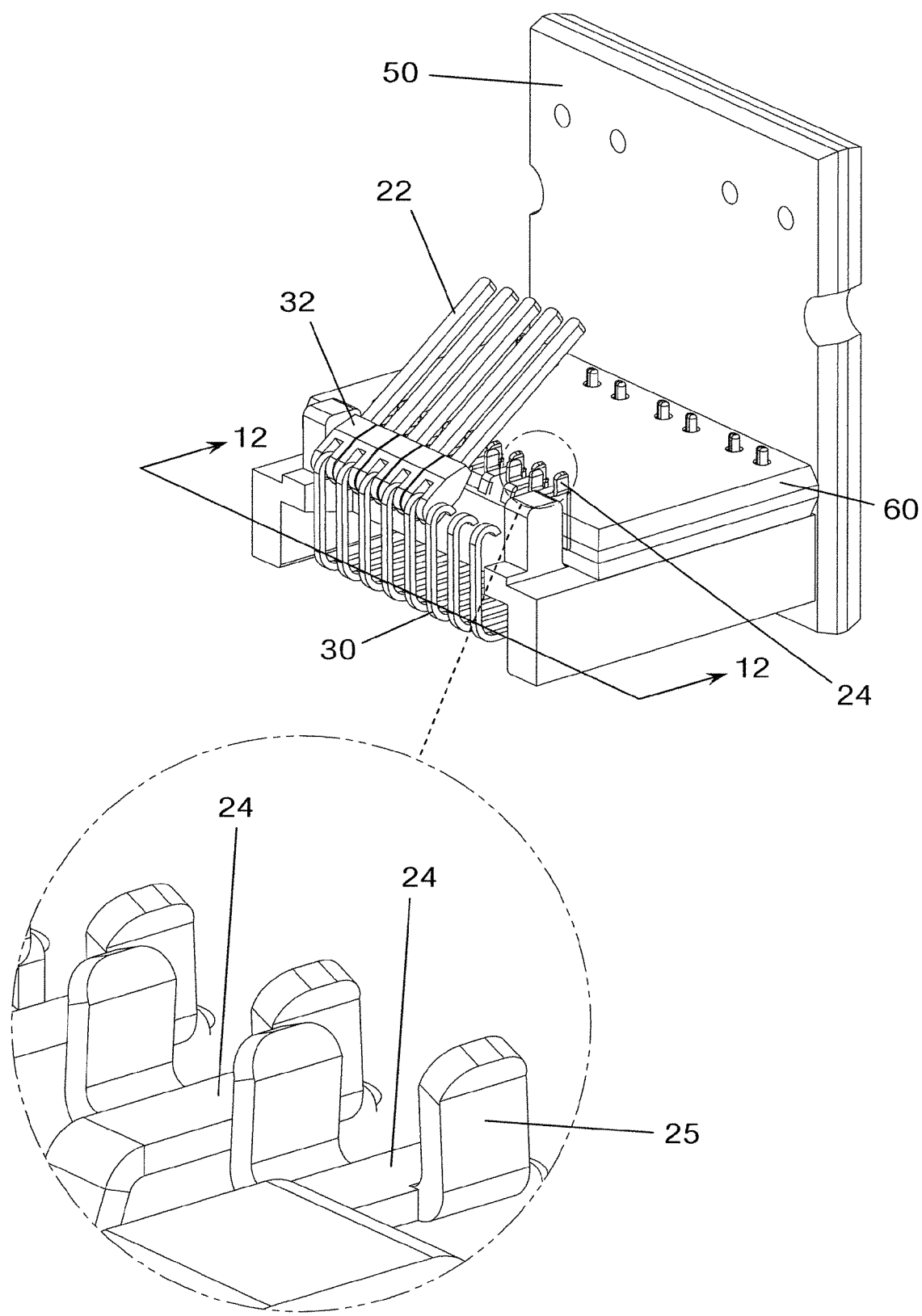
FIG. 11 is a more detailed perspective view of the front sled assembly of FIG. 8.
Figure 12:
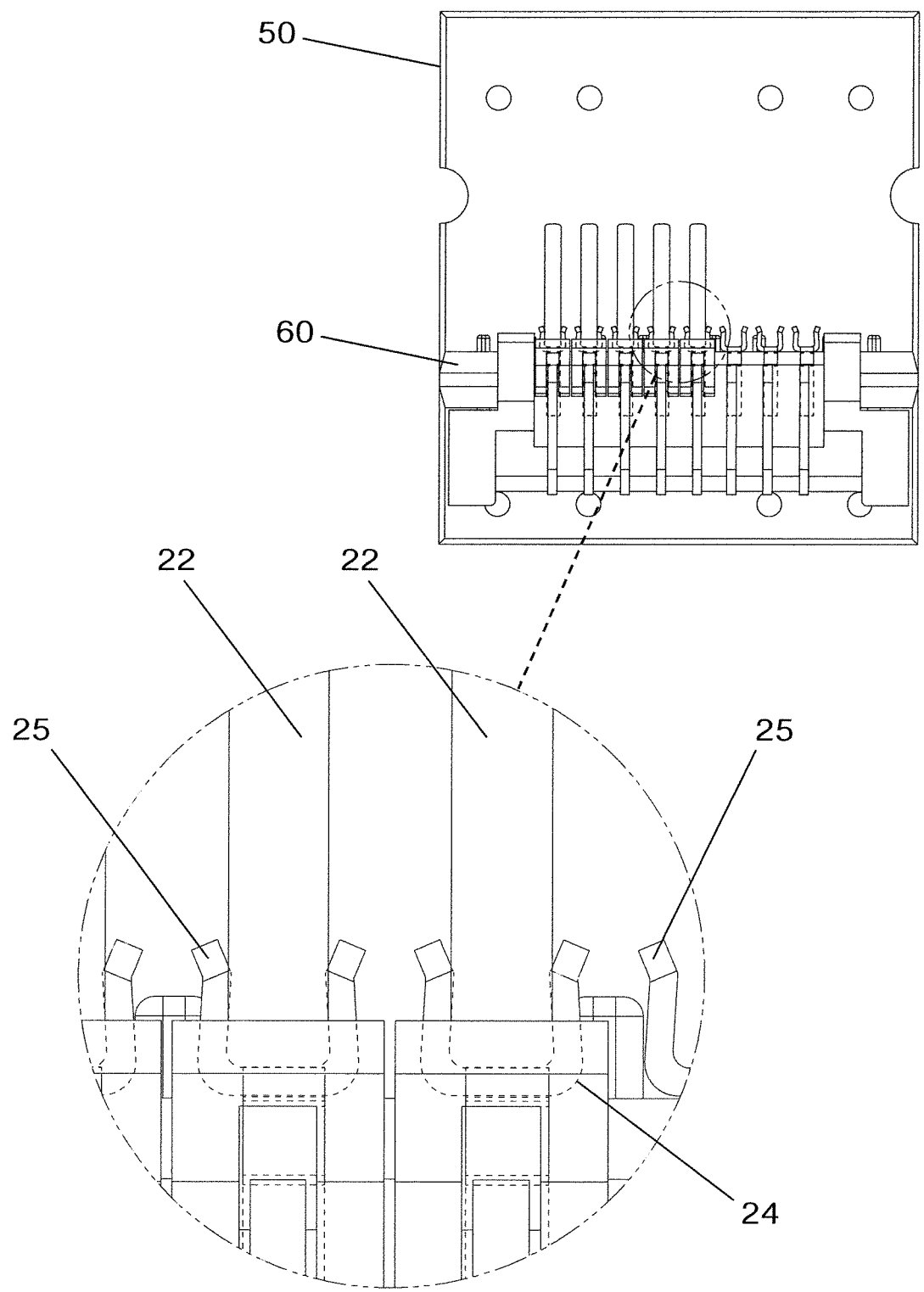
FIG. 12 is a partial front view of the front sled assembly of FIG. 11.

Referring to the more detailed view of FIGS. 11 and 12. PICs 22 are electrically connected to PCB 60 through wiping contacts 24; see particularly upright arms 25 of contacts 24 shown particularly in FIG. 3. Wiping contacts 24 must be relatively thin so as to not disrupt the PICs' 22 ability to rotate freely.

In some embodiments, there may be eight PICs in the communication jack, as shown. Each of the PICs is identical and is formed in the same manner as the rest. As such, fabrication may be simplified. For example, the PICs may be stamped on one strip at 0.04 inches centerline. The shorter length of the PICs reduces the requisite strip width, and thus, overall material costs.

The mechanical spring elements 64 are similar to one another. The mechanical spring elements 64 may be made from plastic resin or ferrous metal, or other metal, to help lower costs.

Figure 10:
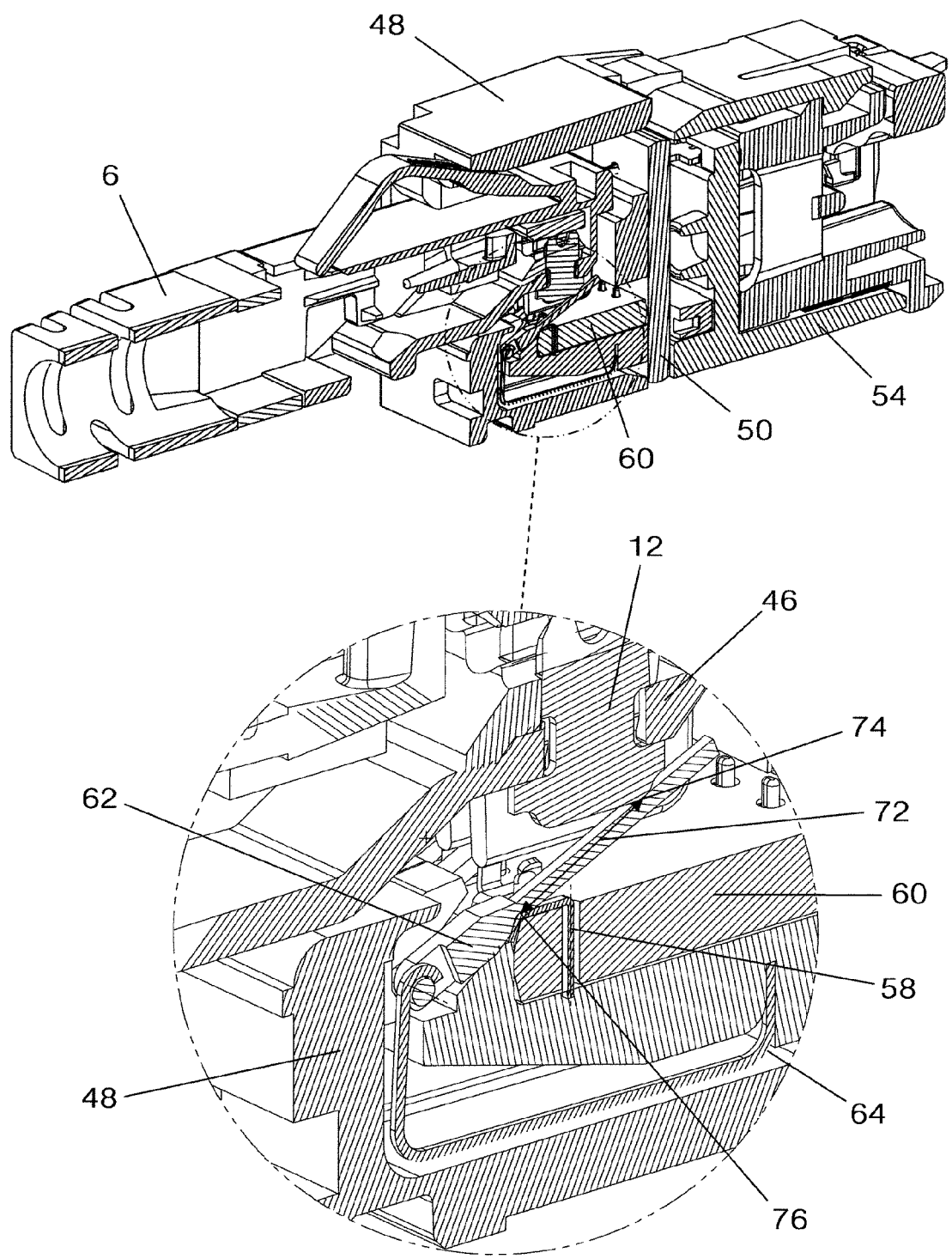
FIG. 10 is a cross-sectional view of the communication jack of FIG. 6 with a mated communication plug in accordance with an embodiment of the present invention.

FIG. 10 is a fragmentary perspective view of a communication jack with a mated communication plug in accordance with a first embodiment of the present invention. The communication jack is shown comprising, among other things, a housing 48 into which the communication plug 6 enters, the horizontal rigid PCB 60, the vertical rigid PCB 50, and a rear sled 54. A portion of the communication jack is expanded to illustrate the electrical and mechanical components and functionalities of the communication jack.

In the expanded view, a plug contact 12 of the entering communication plug 6 is shown making contact with a contact element 46 of a PIC in the communication jack. The contact element 46 is connected to an electrically insulating element 62 of the PIC that is in turn connected to a spring element 64 of the PIC. The contact element 46 may be described as having a free end 74 and a spring end 76. The electrically insulating element 62 is then connected between the spring element 64 and the spring end 76 of the contact element 46.

As the communication plug 6 enters, the plug contact 12 contacts the contact element 46 and forces the free end 74 of contact element 46 to rotate downwards like a lever. The spring end 76 of the contact element 46 contacts the horizontal rigid PCB 60 and in turn lifts up the insulating element 62, forcing the mechanical spring element 64 to move upward. The spring element 64 resists the upward motion, resulting in a contact normal force on the plug contacts 12. Thus, the mechanical integrity of the communication jack is enabled through the use of spring element 64.

Further, it can be seen from the expanded view that the electrical length of the PIC includes only the length of the contact element 46. Thus, the electrical length can be understood as the distance 72 between the free end 74 of the contact element 46 and the spring end 76 of the contact element 46. In some embodiments, this distance may be around 0.115 inches, and more particularly can be less than 0.160 inches. As described above, this design of the communication jack allows for reducing a source of crosstalk in a mated communication plug over a range of signal operating frequencies.

The horizontal rigid PCB 60 is designed to have the same thickness and core construction of the vertical rigid PCB 50. In this manner, the rigid PCBs may be fabricated together and may have compensating capacitors that change in the same manner. This helps improve production yield and allows the use of rigid PCBs, which reduces cost as compared to the flexible PCBs as used in other solutions. The horizontal rigid PCB 60 is connected to the vertical rigid PCB via right angle contacts 68 (shown in FIG. 7). The right angle contacts 68 may be grouped in pairs and located on the top or bottom of the horizontal rigid PCB 60 to help minimize crosstalk. In some embodiments, the horizontal rigid PCB 60 contacts each PIC at the interface of a contact element 46 and an electrically insulating element 62. The horizontal rigid PCB 60 may include one or more crosstalk compensation circuits.

Compensation circuits used in embodiments of the present invention may contain capacitors whose size and shape are designed such that when they are subjected to variation in manufacturing from such sources as etching, the net effect on the electrical performance of the jack is minimized. The capacitors are labeled in the drawings according to the conductive traces to which they are connected. Thus, C46 is a capacitor between the $4^{th}$ and $6^{th}$ conductive trace.

Figure 13A:
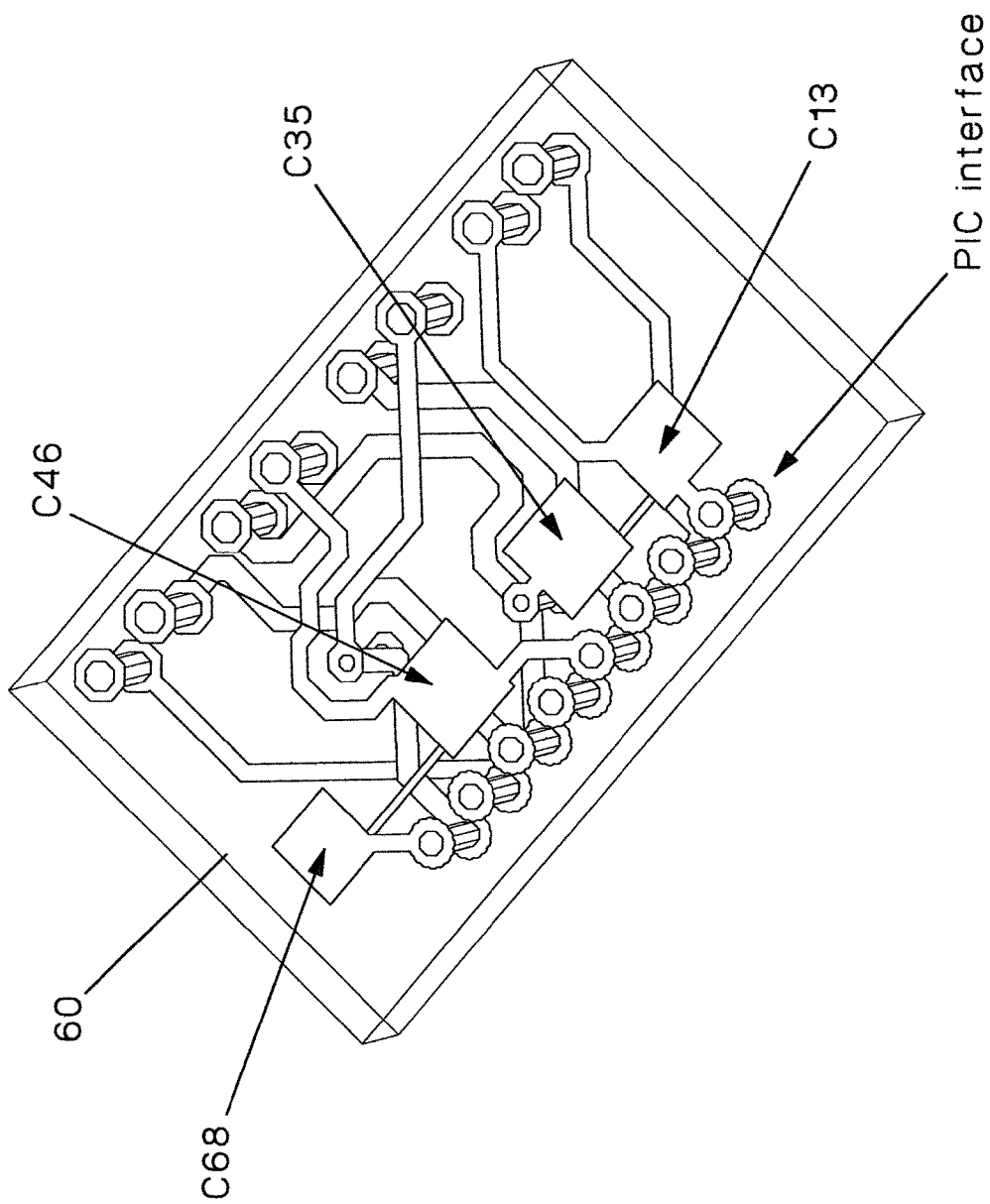
Figure 13B:
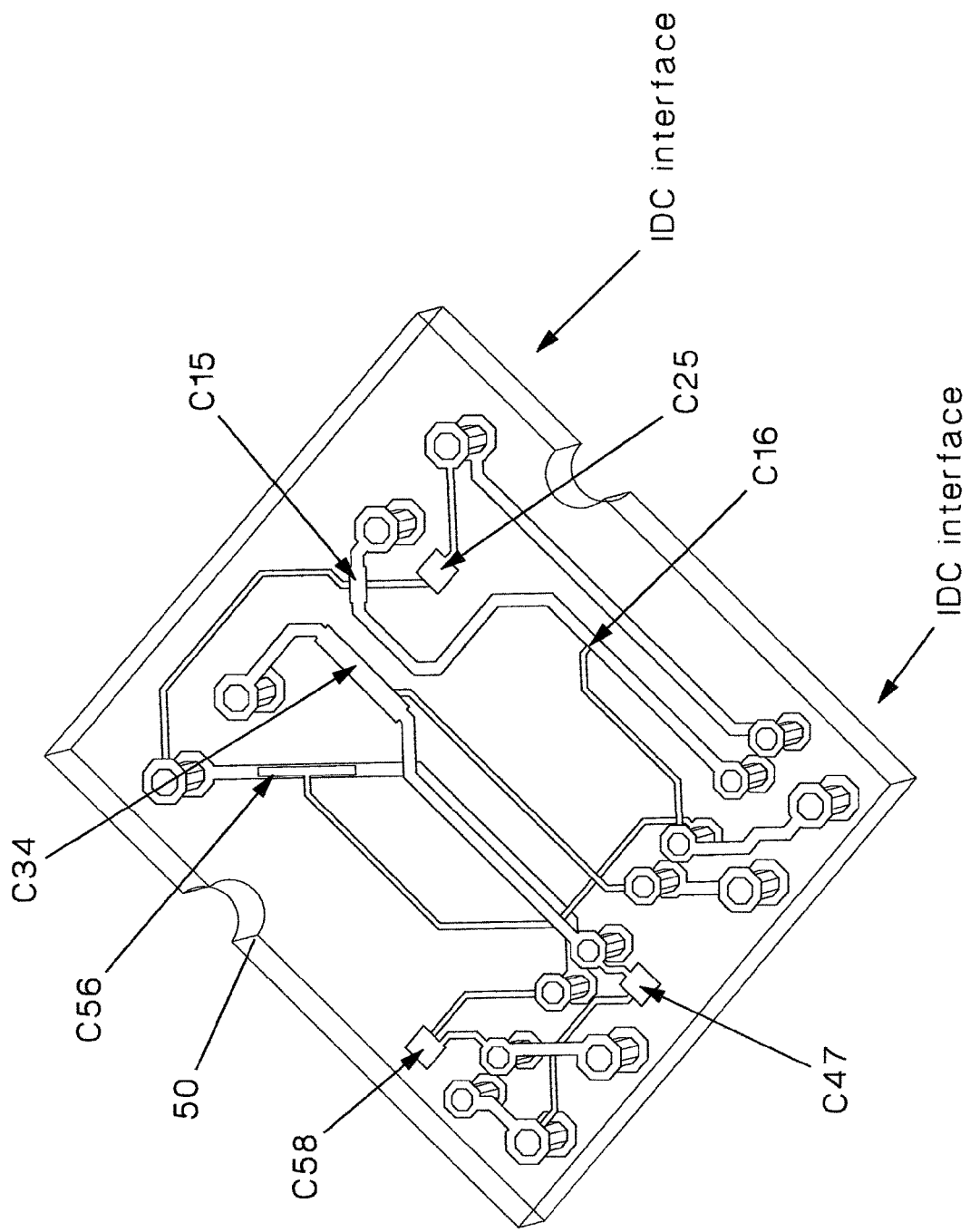
Figure 14:
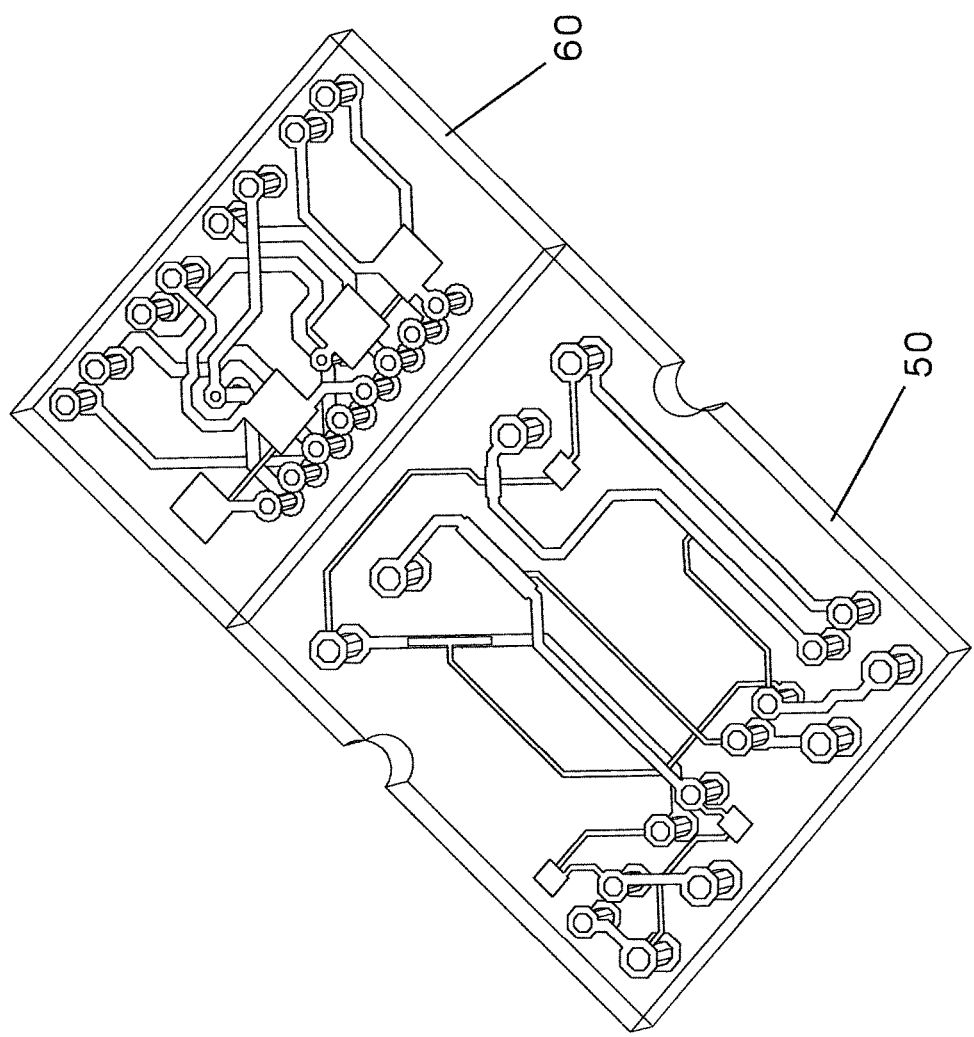
Figure 15:
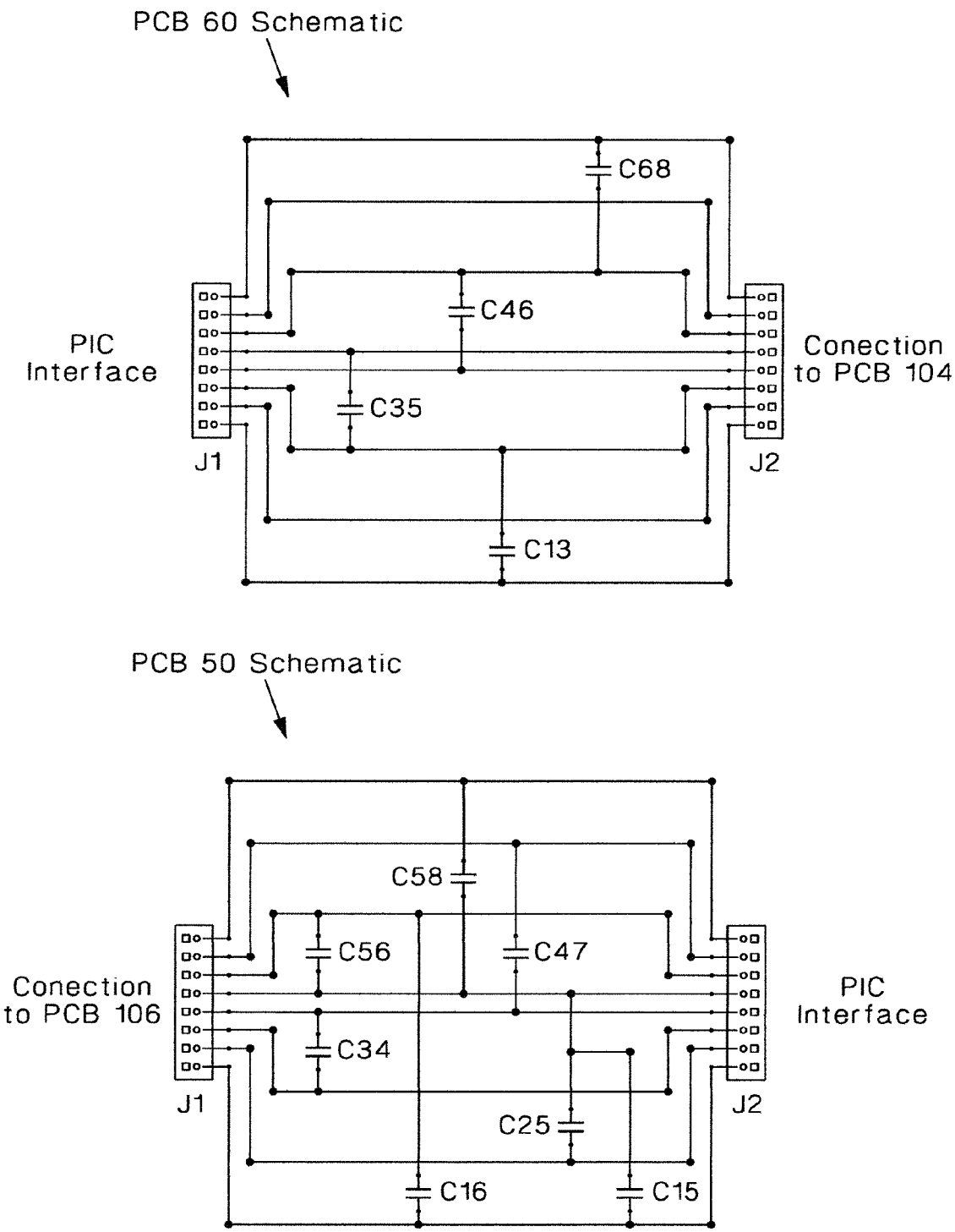

As is known in the art of PCB manufacturing, the etching of a PCB starts with a substrate with copper cladding, then a coating of etch resist is applied. Using the PCB artwork, the desired PCB pattern is imaged and developed, the PCB is then placed into a chemical bath for a specified period of time where the unwanted copper cladding is etched away, and the etch resist is stripped away leaving the final PCB artwork. Variations in any part of the process can create variations in the compensation capacitors. Examples of variation can be variation of the chemical composition of the chemical bath as a function of position within the bath, or exposure time variation of the PCB panel within the chemical bath, or copper cladding thickness variation. FIGS. 13A-13B show the layout of PCBs 60 and 50, and FIG. 14 illustrates how PCBs 60 and 50 can be manufactured side by side in a single panel so that they are subject to a similar manufacturing variation. Typically, multiples of the combined PCBs 60 and 50 are configured in a single PCB panel and etched together. FIG. 15 shows their respective schematics. This reduction in manufacturing variation is done by using a technique where the larger compensating capacitors are made square (C35, C46, C13, C68, C58, C47, and C25), and the smaller crosstalk capacitors (C34, C56, C16, C15) are made following the rules of scenarios 1 to 4 explained below.

More specifically, for pair combination 45-36 (C35, C46, C34, C56) a design criteria referred to as scenario 2 is used; for pair combination 36-12 (C13, C16) the scenario 1 design criteria is used; for pair combination 45-12 (C25, C15) the scenario 1 design criteria is used; for pair combination 36-78 C68 is a square in a single first stage; for pair combination 45-78 both C58 and C47 are square in a single first stage; and for pair combination 12-78 no compensation is needed.

To understand these scenarios, one must first understand that in many CAT6 and CAT6A jacks, a two stage compensation scheme is typically used where the first stage uses a capacitor of opposite polarity to the incident crosstalk caused by the plug, and the second stage uses a capacitor of the same polarity as the incident crosstalk caused by the plug. The first stage capacitor is typically larger than the second stage capacitor. The formula for capacitance between two plates is generally understood by the equation $$C = \epsilon_r \epsilon_0 A/d, \quad (1)$$

where C is the capacitance in farads (F), $\epsilon_r$ is the relative dielectric constant of the material between the plates (typically about 4.4 when using FR4), $\epsilon_0$ is permittivity of free space ($8.85 \times 10^{-12}$ F/m), A is the area of overlap of the two plates in square meters, and d is the distance between the two plates in meters.

Thus, the net crosstalk on the jack used to cancel the crosstalk caused by the plug is approximately the difference between the two capacitors in the first and second stages (neglecting other parasitic crosstalk elements elsewhere in the jack, mutual inductive coupling, and the frequency dependency of the coupling). This can be written as $$C\text{net} = C\text{stage 1} - C\text{stage 2}, \quad (2)$$

where Cnet is the net capacitance, Cstage 1 is the capacitance in stage 1, and Cstage 2 is the capacitance in stage 2. Equation 1 shows that capacitance is proportional to area. Therefore, if one assumes that both capacitors are created on the same circuit board panel (thus the same etching, dielectric material, and separation), $$C\text{net} \sim A\text{stage 1} - A\text{stage 2}, \quad (3)$$

which states that the net capacitance is proportional to the difference in the area of overlap of the plate capacitors comprising stage 1 and stage 2 (Astage 1 and Astage 2, respectively).

Since the capacitors for stage 1 and stage 2 are made on the same panel, any over-etching or under-etching is assumed to affect both capacitors equally. Therefore, the change in net capacitance for a circuit board that is over-etched or under-etched is given by $$\Delta C\text{net} \sim \Delta A\text{stage 1} - \Delta A\text{stage 2}, \quad (4)$$

where $\Delta$Cnet refers to the change in net capacitance, and $\Delta$Astage 1 and $\Delta$Astage 2 both refer to the change in area for stage 1 and stage 2, respectively. By selectively choosing the dimensions of the capacitors comprising stage 1 and stage 2, the overall $\Delta$Cnet can be minimized for different types of etching variation.

Four Scenarios

In general, there are four scenarios that must be examined. For reference, a jack using 2 stages of compensation can have a variety of methods of doing this compensation. Assuming all compensating crosstalk (of opposite polarity of the incident crosstalk caused by the plug) is located in stage 1, and all intentional crosstalk (of the same polarity as the incident crosstalk caused by the plug) is located in stage 2, there are four unique scenarios that should be examined because for a given pair combination, there are four coupling mechanisms. For example, pair combination 45-36 can have coupling between 3-4 and 5-6 (crosstalk) and coupling between 4-6 and 3-5 (compensating crosstalk). The four scenarios come from the fact that stage 1 can have 1 or 2 compensating elements, and stage 2 can have 1 or 2 compensating elements (resulting in four combinations).

For all scenarios addressed below, it is assumed that all capacitors are built with the same core thickness and, the same dielectric material, and are subject to the same over-etching or under-etching during PCB manufacturing. This assumption is reasonable if the capacitors are physically located near each other during PCB manufacturing (within a few inches). Additionally, these results assume no edge effects or other variations to the capacitance (i.e., equation 1 holds). These results can easily be slightly modified to account for the change in capacitance caused by capacitor edge effects, and/or other effects caused by distributed electrical parameters.

Scenario 1: 1 Capacitor in Stage 1, and 1 Capacitor in Stage 2

For this scenario, there is 1 capacitor in stage 1 and 1 capacitor in stage 2. The stage 1 capacitor is larger than the stage 2 capacitor. Due to the fact the stage 1 capacitor is larger, its area will vary more than the stage 2 capacitor for the same etching variation. Therefore, to minimize the change in the stage 1 capacitor 53 (see FIG. 16 for an example), it should be a square (with side dimensions X). The stage 2 capacitor 55 is a rectangle with dimensions Y and Z. The areas of both capacitors are set by the designer to achieve the necessary performance (area of A for the first stage, and B for the second stage).

Therefore, since the effective areas of overlap (A (stage 1) and B (stage 2)) of these capacitors are known, $$X*X = A, \quad (5)$$

and $$Y*Z = B. \quad (6)$$

Since the net capacitance (proportional to net area, Anet) between them is also set by the designer, $$A\text{net, scenario 1 (ideal case)} = A - B = X^2 - Y*Z. \quad (7)$$

Additionally, if we want to minimize the effect of etching, we can try to achieve the same Anet with an over-etching or under-etching of E (E will be positive with under-etching and negative with over-etching). This leads to the equation $$A\text{net, scenario 1 (with etching error } E) = (X+E)^2 - (Y+E)*(Z+E) = X^2 - Y*Z. \quad (8)$$

Solving equations 5 with respect to X gives $$X = \sqrt{A}. \quad (9)$$

Substituting this value of X into equation 8 gives $$(\sqrt{A}+E)^2 - (Y+E)*(Z+E) = (\sqrt{E})^2 - Y*Z, \quad (10)$$

which can be expanded to $$A + 2*E*\sqrt{A} + E^2 - Y*Z - Z*E - Y*E - E^2 = A - Y*Z. \quad (11)$$

Cancelling identical terms on both sides of equation 11 gives $$2*E*\sqrt{A} - Z*E - Y*E = 0. \quad (12)$$

Dividing both sides of equation 12 by E yields $$2*\sqrt{A} - Z - Y = 0. \quad (13)$$

Substituting Y=B/Z (from equation 6) into equation 13, multiplying both sides of equation 13 by −1, and rearranging the terms, yields $$Z - 2*\sqrt{A} + B/Z = 0. \qquad (14)$$

Multiplying both sides of equation 14 by Z gives $$Z^2 - 2*Z*\sqrt{A} + B = 0. \qquad (15)$$

This is a quadratic equation which can be solved for Z as $$Z = \sqrt{A} \pm \sqrt{(A-B)}. \qquad (16)$$

Similarly solving equation 13 for Y gives $$Y = \sqrt{A} \mp \sqrt{(A-B)}. \qquad (17)$$

Also, $X = \sqrt{A}$ (from equation 5).

Note that depending on the sign used in equation 16, the opposite sign must be used in equation 17. Also note that in equations 9, 16, and 17 the etching factor, E, is no longer in these equations; consequently, for any change in etching, these equations hold true. Thus, the net capacitance will not change given any change in etching. Therefore, for a two-stage compensating scheme having a first stage compensating capacitor of area $A=X^2$, a second stage of $B=Y*Z$ (rectangle), with Anet, scenario 1 (with etching error E)=Anet, scenario 1 (ideal case), equations 9, 16, and 17 can be used to determine X, Y, and Z.

Scenario 2: 2 Capacitors in Stage 1, and 2 Capacitors in Stage 2

Figure 17:
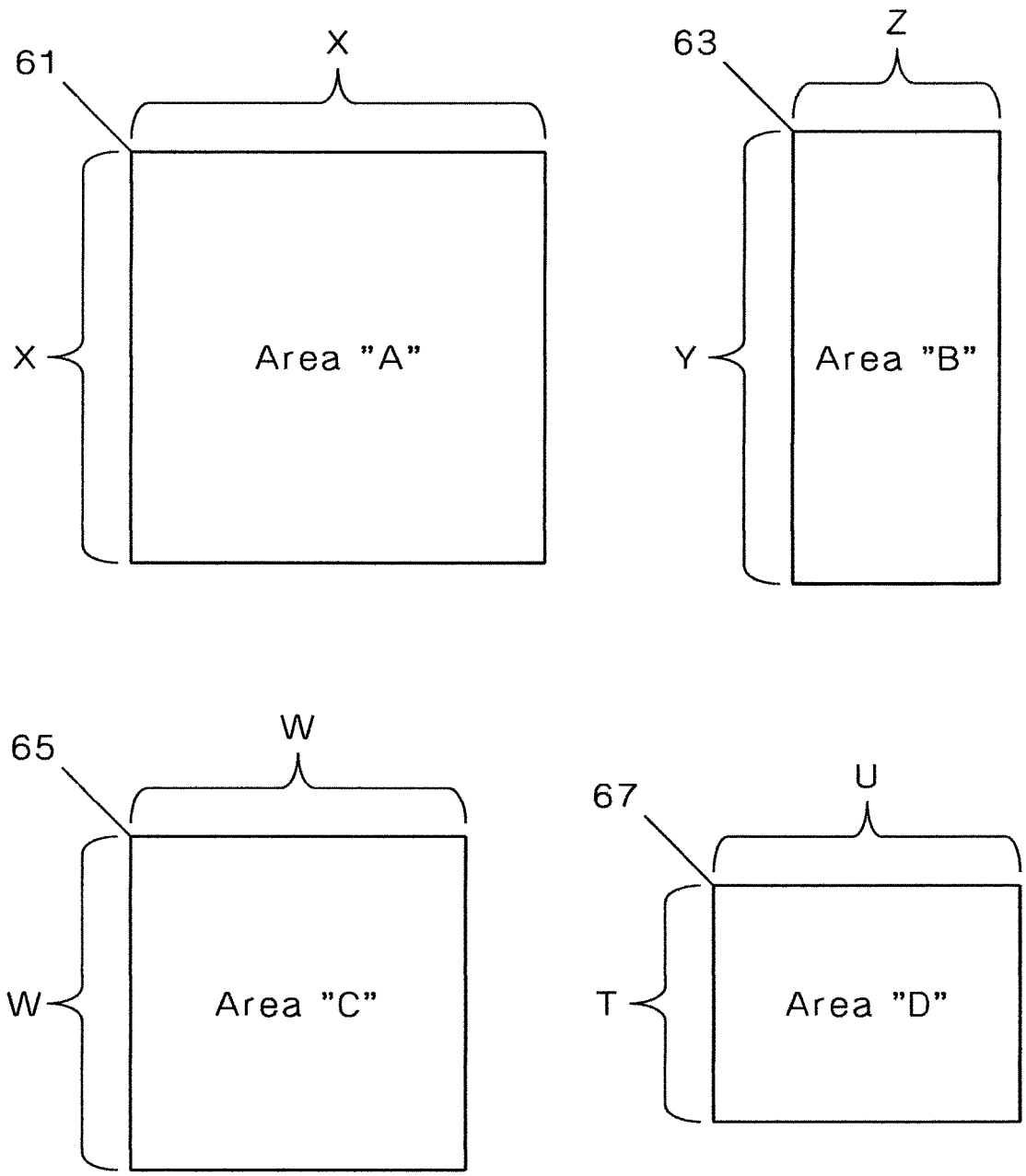

In this scenario there are two capacitors in stage 1, and 2 capacitors in stage 2. See FIG. 17 for a visualization of these capacitors. Each capacitor can have a different size. The net area of the two capacitors 61 and 65 in stage 1 is larger than the net area of the capacitors 63 and 67 in stage 2. Following the same logic as was done in scenario 1, assuming that the capacitors of stage 1 are squares and the capacitors of stage 2 are rectangles (A, B, C, and D are areas that are given), $$X*X = A, \qquad (18)$$

$$W*W = C, \qquad (19)$$

$$Y*Z = B, \qquad (20)$$

and $$T*U = D. \qquad (21)$$

For this scenario, Anet is equal to $$A\text{net, scenario } 2 = A + C - B - D. \qquad (22)$$

Since the net area needs to be the same before and after any etching effects E, substituting equations 18 to 21 into equation 22, $$A\text{net, scenario 2 (ideal case)} = X^2 + W^2 - Y*Z - T*U, \qquad (23)$$

and $$A\text{net, scenario 2 (with etching error } E) = (X+E)^2 + (W+E)^2 - (Y+E)*(Z+E) - (T+E)*(U+E). \qquad (24)$$

Following a similar derivation as scenario 1, Y and Z can be solved for as $$Y = \sqrt{A} + \sqrt{C} - (T+U)/2 \pm \sqrt{((T+U)/2 - \sqrt{A} - \sqrt{C})^2 - B)}, \qquad (25)$$

$$Z = \sqrt{A} + \sqrt{C} - (T+U)/2 \pm \sqrt{((T+U)/2 - \sqrt{A} - \sqrt{C})^2 - B)}, \qquad (26)$$

and $X = \sqrt{A}$, $W = \sqrt{C}$, and $T*U = D$ (from equations 18, 19, and 21).

Note that Y and Z can both be interchanged.

Thus, for given areas A, B, C, and D and given dimensions T and U, one can find a Y and Z that eliminate the effect of etching. Equations 25 and 26 are the most important and most universal equations for this as all other scenarios can be derived from these equations. Note that equations 16 and 17 can be derived from equations 25 and 26 by setting C, T, and U equal to zero.

Under the special case where areas A=C and B=D, one can use equations 16 and 17 derived in scenario 1.

Scenario 3: 2 Capacitors in Stage 1, and 1 Capacitor in Stage 2

In this scenario, one can use equations 25 and 26 but set T and U (and consequently D) equal to zero.

Scenario 4: 1 Capacitor in Stage 1, and 2 Capacitors in Stage 2

In this scenario, one can use equations 25 and 26 but set C (and consequently W) equal to zero.

Figure 18:
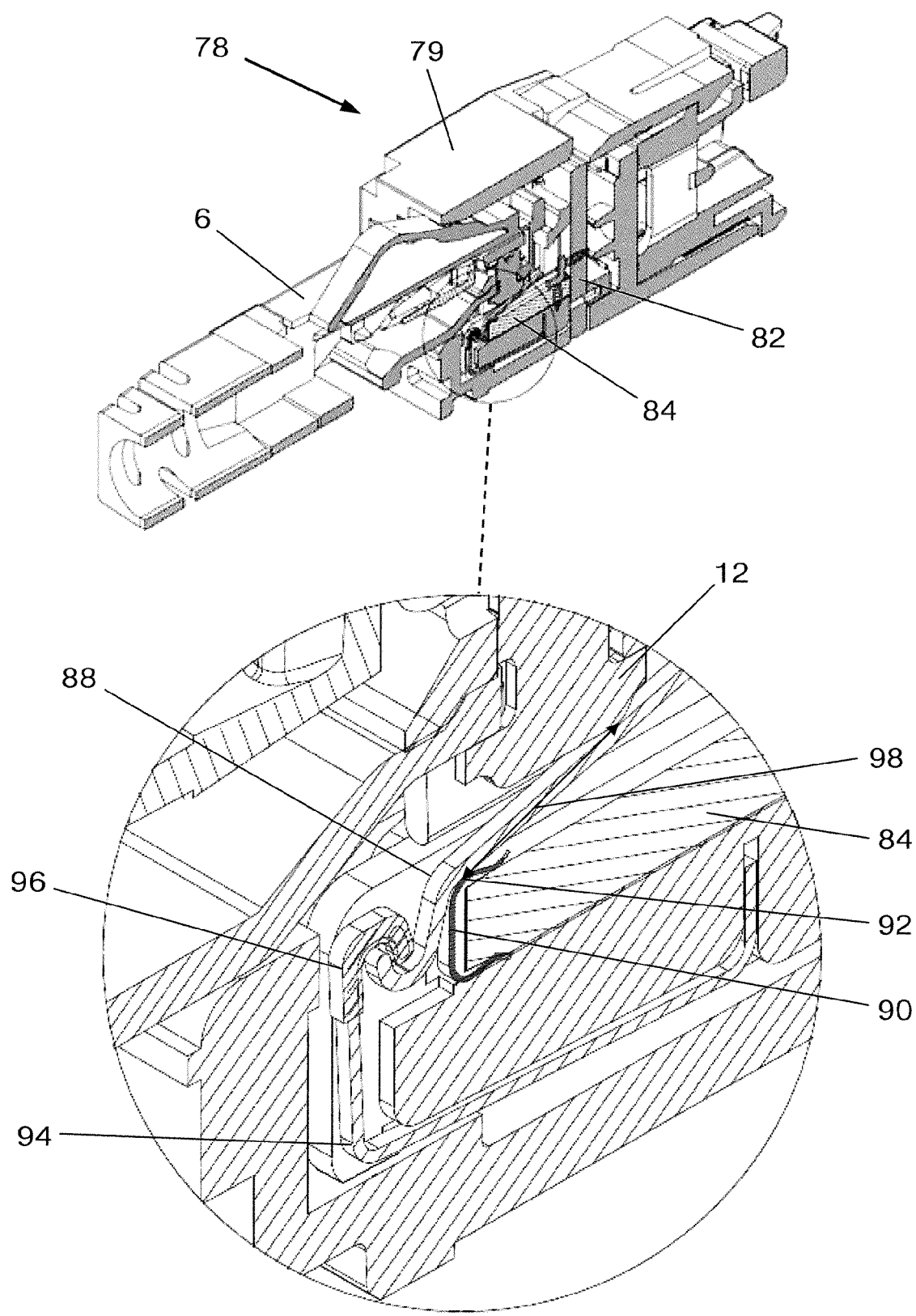
FIG. 18 is a cross-sectional perspective view of another communication jack with a mated communication plug in accordance with an embodiment of the present invention.

FIG. 18 is a fragmentary side view of a communication jack 78 with a mated communication plug 6 in accordance with an embodiment of the present invention.

Communication jack 78 includes, among other things, a housing 79 into which a communication plug 6 enters, a horizontal rigid PCB 84, and a vertical rigid PCB 82. A portion of communication jack 78 is expanded to illustrate the mechanical and electrical functionalities of the communication jack.

In the second embodiment, contact between the horizontal rigid PCB 84 and the PICs of the communication jack is made through a clip-on style contact 90. In this embodiment, when the plug contacts 12 press downward on the contact elements 88 of the PICs, the PICs rotate around a centerline contact radius 92. Operation is as described above, with the contact normal force resulting from the resistance of spring elements 94. The PCBs 82, 84 can have compensation the same as, or similar to, that previously described for PCBs 50, 60, respectively.

As described above, the contact elements 88 are respectively connected to the spring elements 94 via electrically insulating elements 96. In some embodiments, the electrically insulating element 96 may be omitted if the spring element 94 is made of or coated with an insulating material, such as insert-molded plastic or a powder coating.

In the foregoing descriptions, the communication jack has been described as an RJ45 communication jack, such as a CAT6 or CAT6A jack. However, the invention described here is not limited to such an application. It may be applied just as well in other types and/or configurations of jacks or couplers. Other examples are possible as well.

Figure 19:
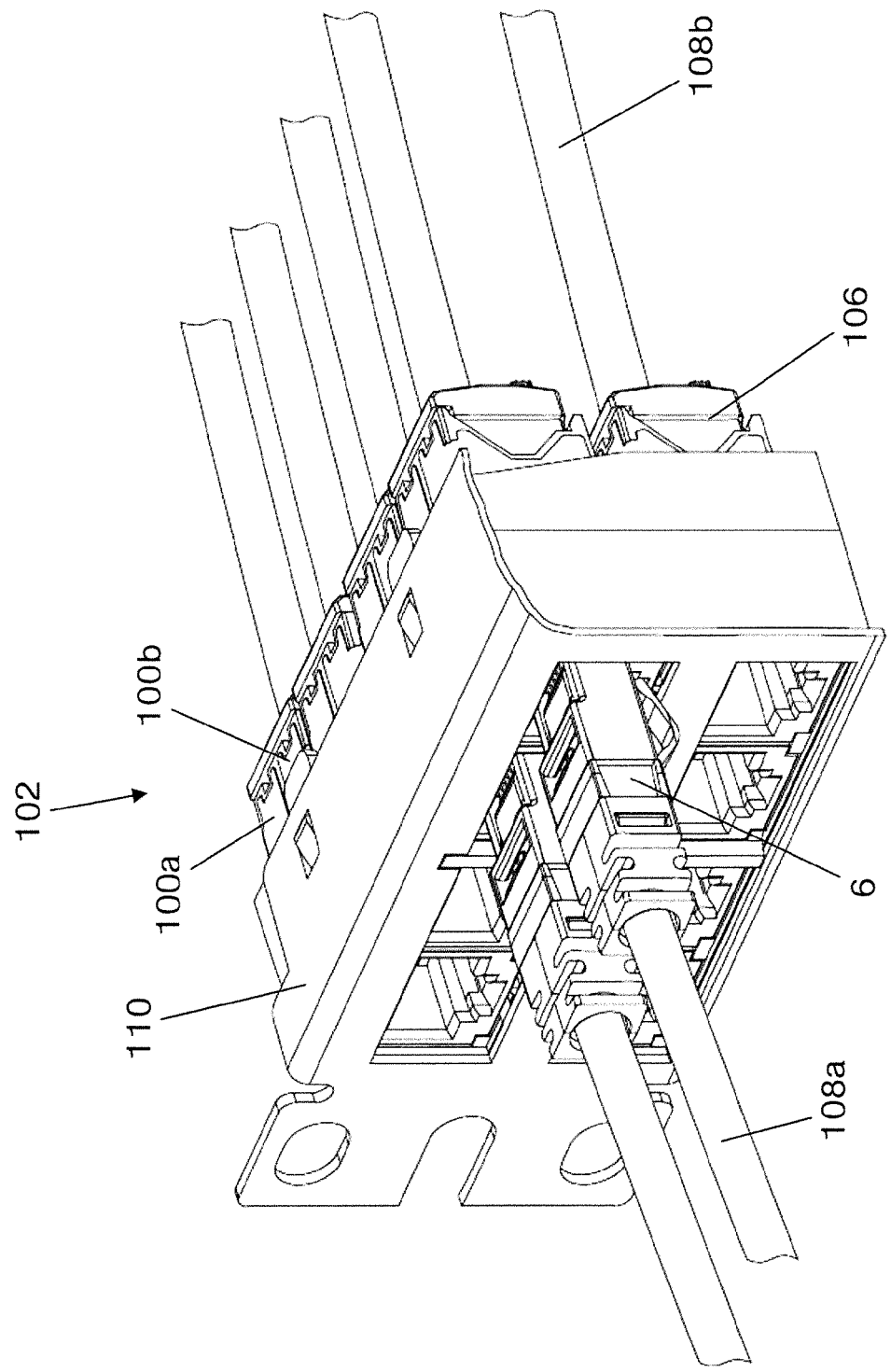
FIG. 19 is a fragmentary perspective view of a communication system according to the present invention.

The present invention may be used in a communication system such as that depicted in FIG. 19. Communication system 102 is shown comprising foil labels 100a and 100b, a communication plug 6, communication jacks 106, communication cables 108, and equipment 110. Communication jack 106 may be any of the jacks, or combinations thereof, as described herein. While FIG. 19 depicts a particular number of communication cables 108, the number is purely one example, and more or fewer communication cables are possible as well. Equipment 110 is illustrated as a patch panel, but is not so limited. The equipment 110 may be either passive or active equipment. Examples of passive equipment include modular patch panels, punch-down patch panels, couple patch panels, wall jacks, etc. This list is not meant to be limiting, as other types of passive equipment are possible as well. Examples of active equipment include Ethernet switches, routers, servers, physical layer management systems, power-over-Ethernet equipment as often found in data centers and telecommunications rooms, and security devices (including cameras and sensors) and door access equipment. Other examples of active equipment include workstation peripherals, such as telephones, fax machines, computers, printers, and others. This list is not meant to be limiting, as other types of active equipment are possible as well. The communication system 102 may further include cabinets, racks, cable management and overhead routing systems, and other such equipment.

The communication cables 108 may be unshielded twisted pair (UTP) cables, and more particularly. Category 6A cables that can operate at 10 GB/s. However, the present invention may be equally applied to or implemented in a variety of communications cables. Examples of possible communications cables include shielded cables, unshielded cables, CAT5E, CAT6, CAT6A, CAT7, CAT7A and other twisted pair Ethernet cables, and others. This list is not meant to be limiting, as other types of cables are possible as well.

Some of the communication cables 108 may be terminated directly into the equipment 110, and others may be terminated into the communication jacks 106, communication plugs 6, or combinations thereof. The use of communication jacks 106 may eliminate the need for the foil labels 100, and may further improve ANEXT, as described above. Further, the communication cables 108 may be processed into looms, or bundles, of cables and may be processed into preterminated looms.

Communication cables 108 may be used in a variety of structured cabling applications such as patch cords, zone cords, backbone cabling, and horizontal cabling, though the present invention is not limited to such applications. In general, the present invention may be used in military, industrial, telecommunications, computer, data communications, and other cabling applications.

A method of manufacturing the communication jack described above is also contemplated. The method may include providing a PCB that includes one or more crosstalk compensation circuits, and contacting a PIC to a contact on the PCB. The PIC may, as described above, include a spring element, a contact element pivotally connected to the spring element, and an electrically insulating element that connects the contact element to the spring element. As in the above-described embodiments, the PCB may be a rigid PCB, and the contact on the PCB may contact the PIC at the interface of the contact element and the electrically insulating element.

FIGS. 20-29 illustrate another embodiment of the present invention. The embodiment of RJ45 jack 138 is similar to the previously described jack, but eliminates the PIC's plastic overmolded sleeves which mechanically engage the springs for the PICs, which modifies the wiping contacts to reduce the chance of hi-pot failures, and which provides a comb structure in the front sled to constrain the PICs. In place of the overmolded sleeves on the PICs, the RJ45 jack 38 of FIGS. 20-29, includes a front sled with breakaway plastic insulator caps which cover the tips of the springs, and breakaway from the sled, when the springs are inserted into the sled. In the present invention, the wiping contacts on the horizontal circuit board have been modified to eliminate the upright arms that extend beyond the footprint of the PICS, and the PIC/spring/wiping contact structures have modified so that the PICs/springs/wiping contacts have a coincident contact point at the insulator caps.

Figure 20:
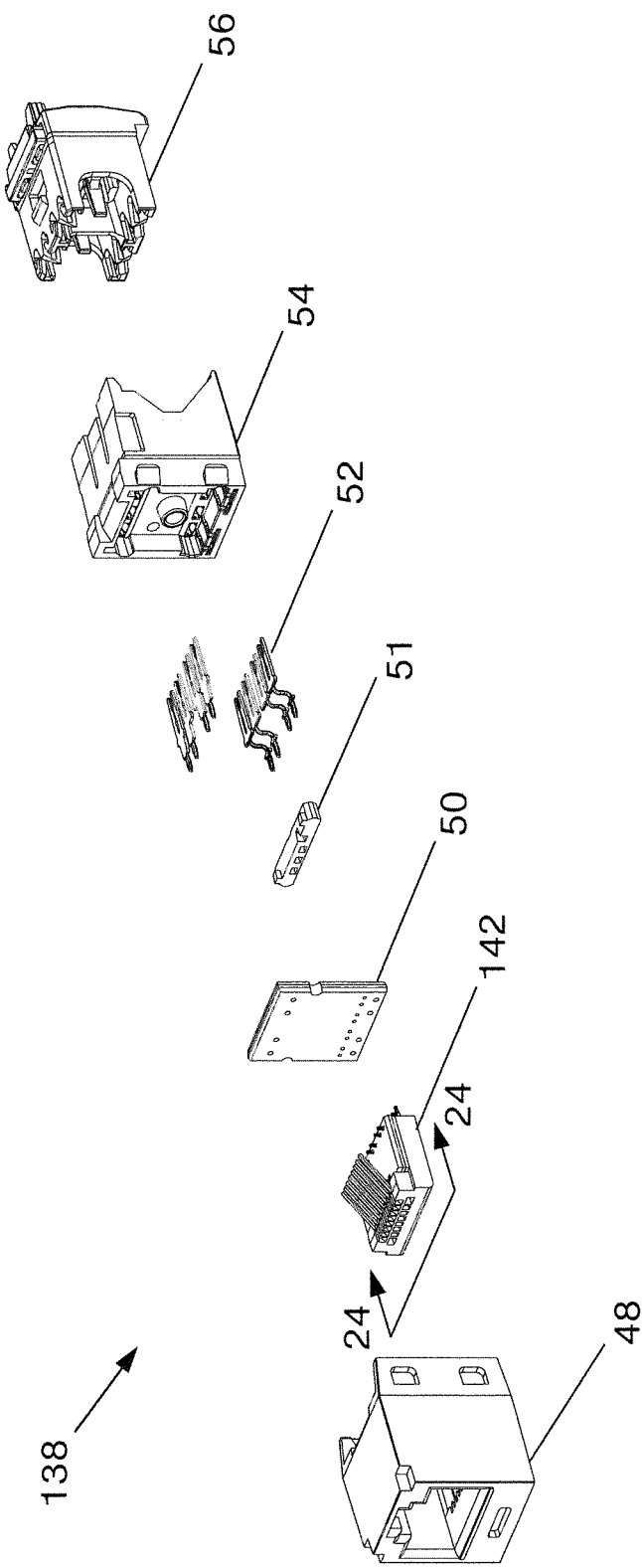
FIGS. 20-29 are various views of another embodiment of a communication jack according to the present invention.

An exploded view of jack 138 can be seen in FIG. 20. Jack 138 includes a front housing 48, front sled assembly 142, vertical rigid PCB 50, insulation displacing contacts (IDC's) 52, IDC support structure 51, rear housing 54, and termination cap 56.

Figure 21:
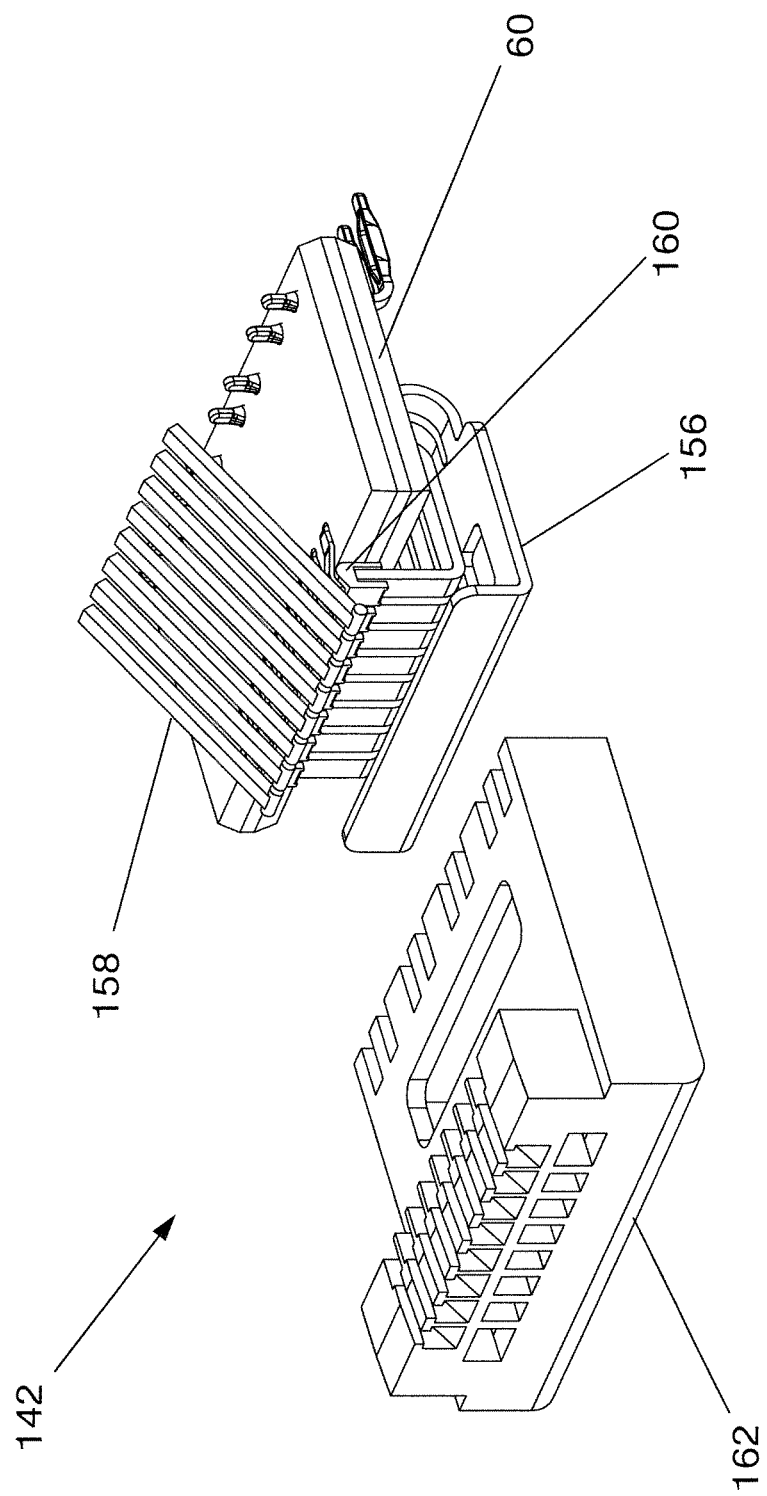
Figure 22:
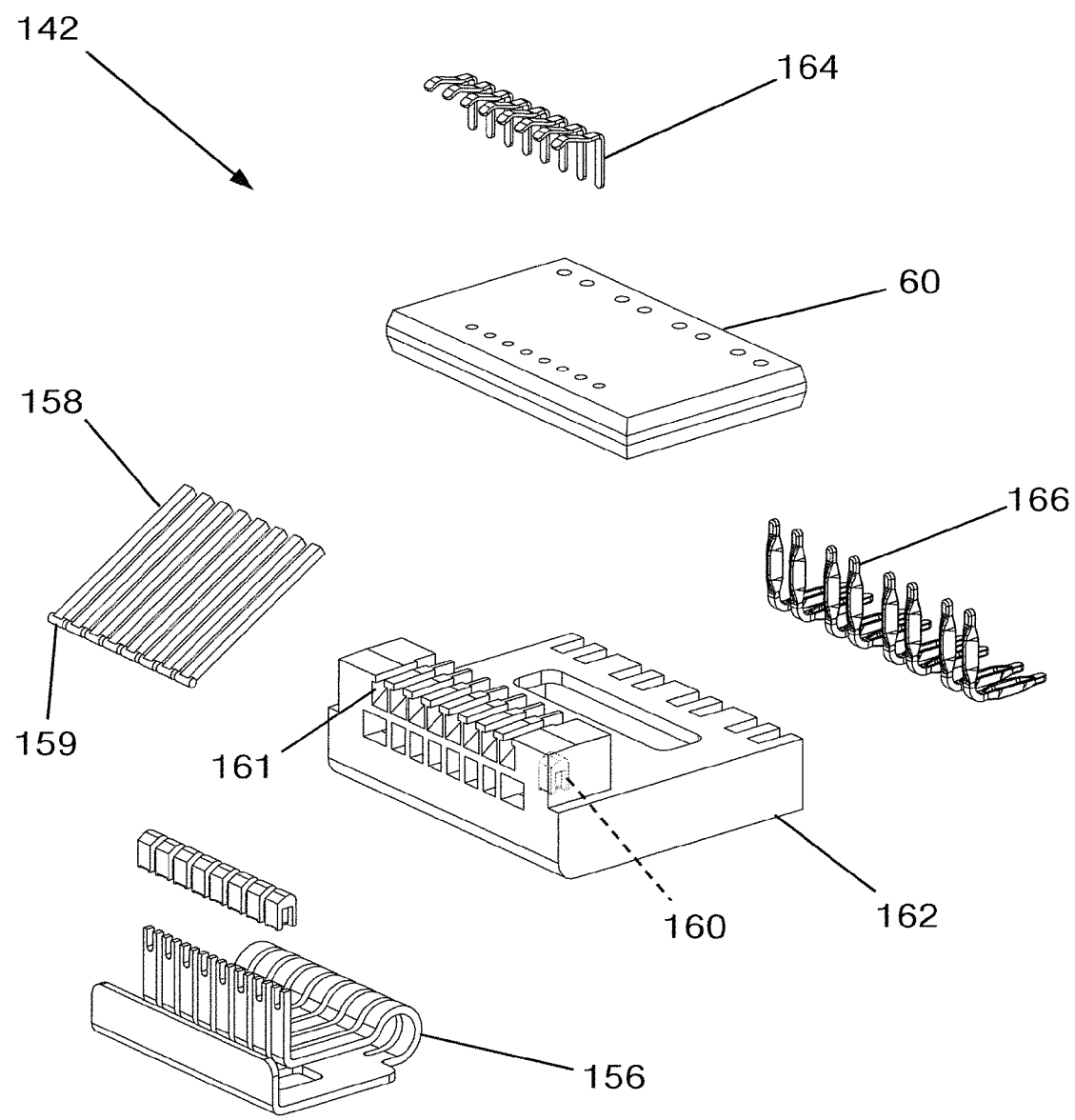

Like the jack previously described, jack 138 uses two rigid circuit boards 50, 60, and a separate spring 156 (FIG. 21) mechanically actuates the PICs 158. In the present invention, PICs 158 do not require a micro-overmolding operation to achieve electrical insulation from spring 156. Plastic insulator caps 160 cover the tips of spring 156, providing the necessary insulation. FIG. 21 shows this interaction in front sled assembly 142. Note that the plastic sled 162 has been exploded away to better show the location of spring 156. FIG. 22 shows an exploded view of front sled assembly 142, which includes horizontal rigid PCB 60, spring 156. PICs 158, insulator caps 160 which are initially part of plastic sled 162. PCB 60 to PIC contacts 164, and 90° PCB 60 to PCB 50 contacts 166.

Figure 23:
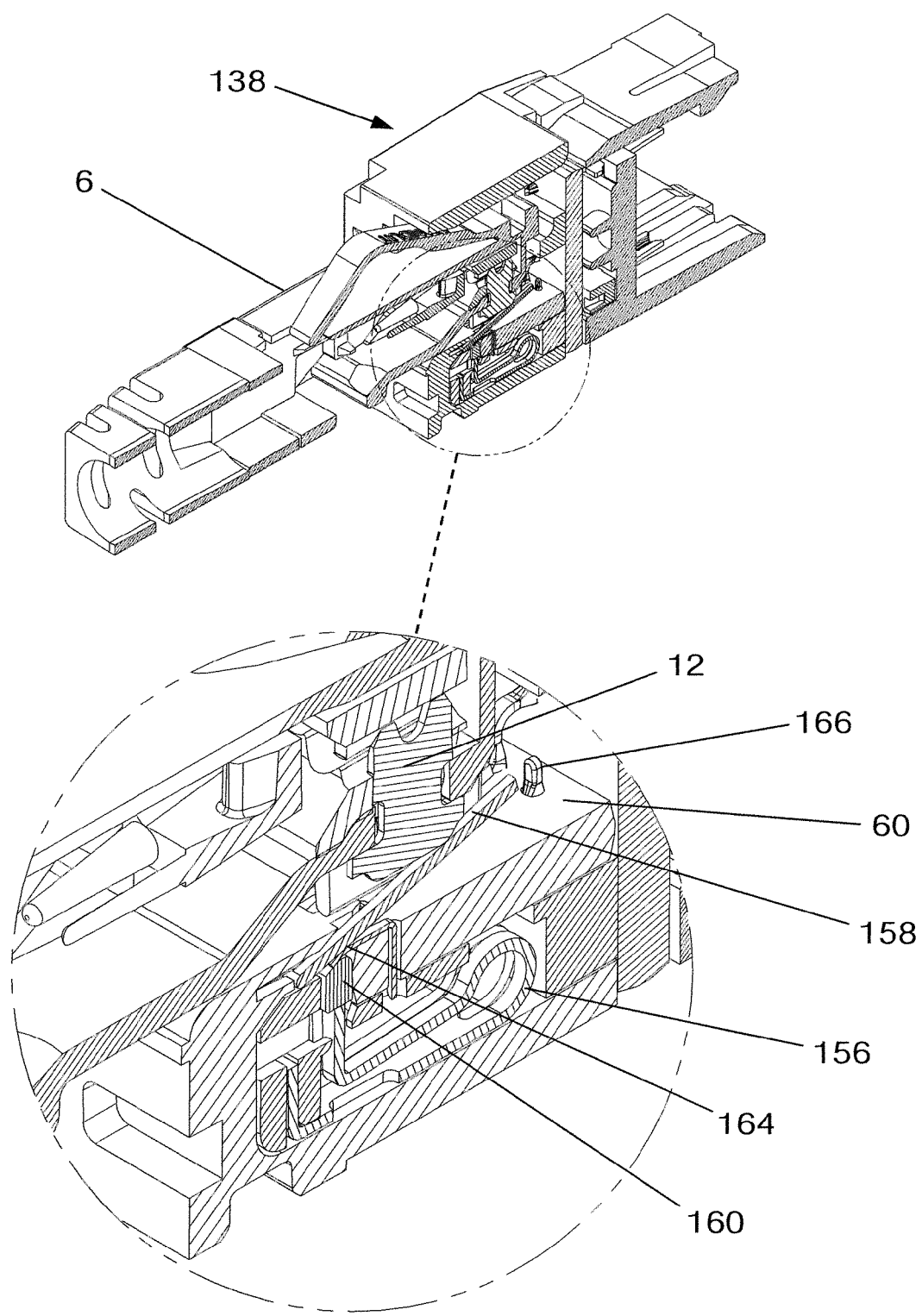
Figure 24:
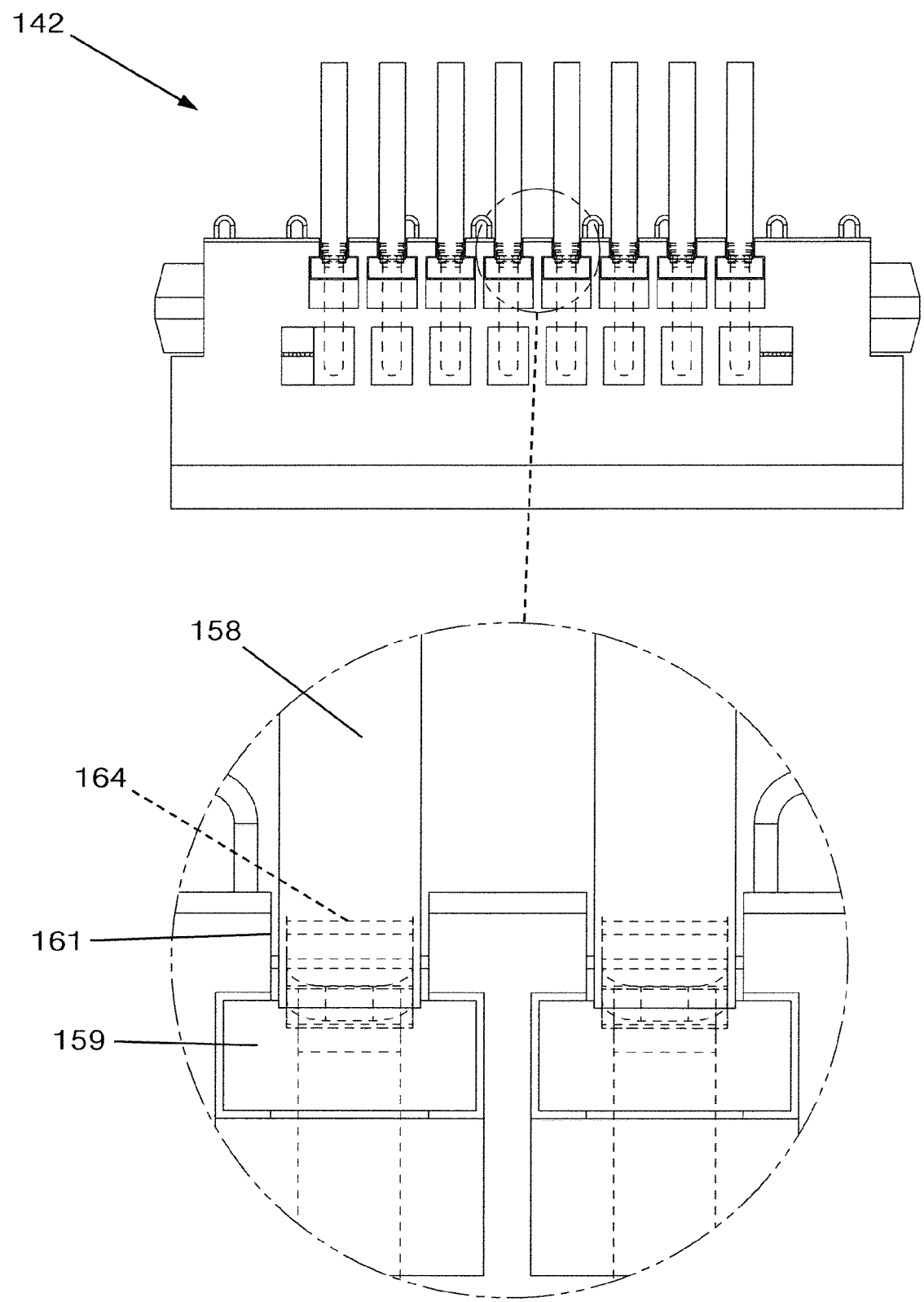

FIG. 23 shows a cross-sectional view of an RJ45 plug 6 inserted into jack 138. The plug contacts 12 of plug 6 make electrical contact with PICs 158 of jack 138. As PICs 158 are pressed down by plug contacts 12, spring 156 flexes/compresses and presses back against PICs 158. This provides sufficient normal force between plug contacts 12 and PICs 158 to ensure proper electrical bond. Notice that PCB to PIC contact 164 is pressed between insulator cap 160 and PIC 158. This ensures that the interface between PIC 158 and PCB to PIC contact 164 is under compression and makes a good electrical connection. This eliminates the need for wiping contacts with arms previously described. Because PCB to PIC contacts 164 do not extend beyond the sides of PICs 158 (as shown in FIG. 24), hi-pot/high potential testing) risk is mitigated as compared to the wiping contacts previously described. Formed ends 159 of PICs 158 are captured in slots 161 of sled 162.

Figure 25:
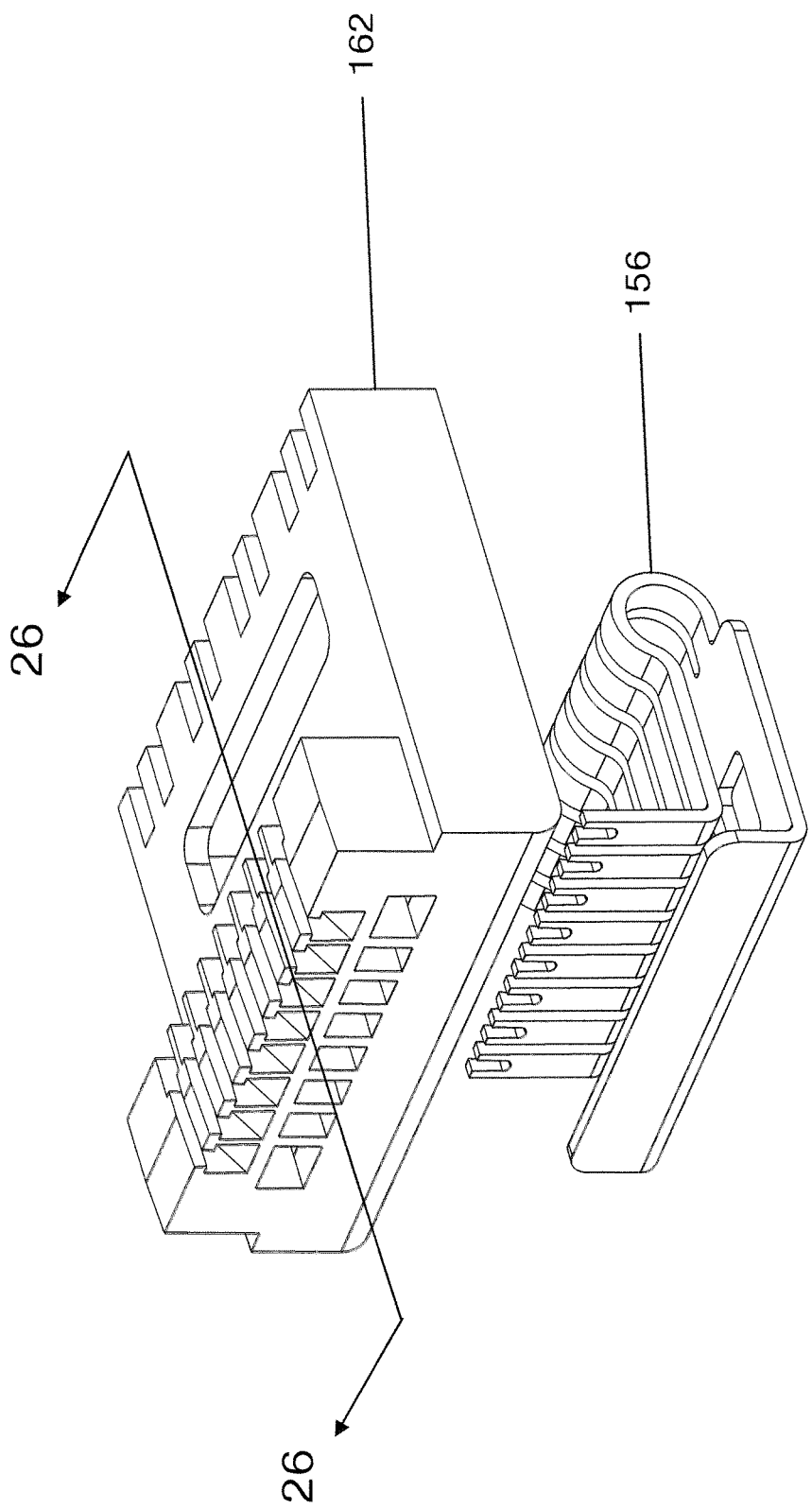
Figure 26:
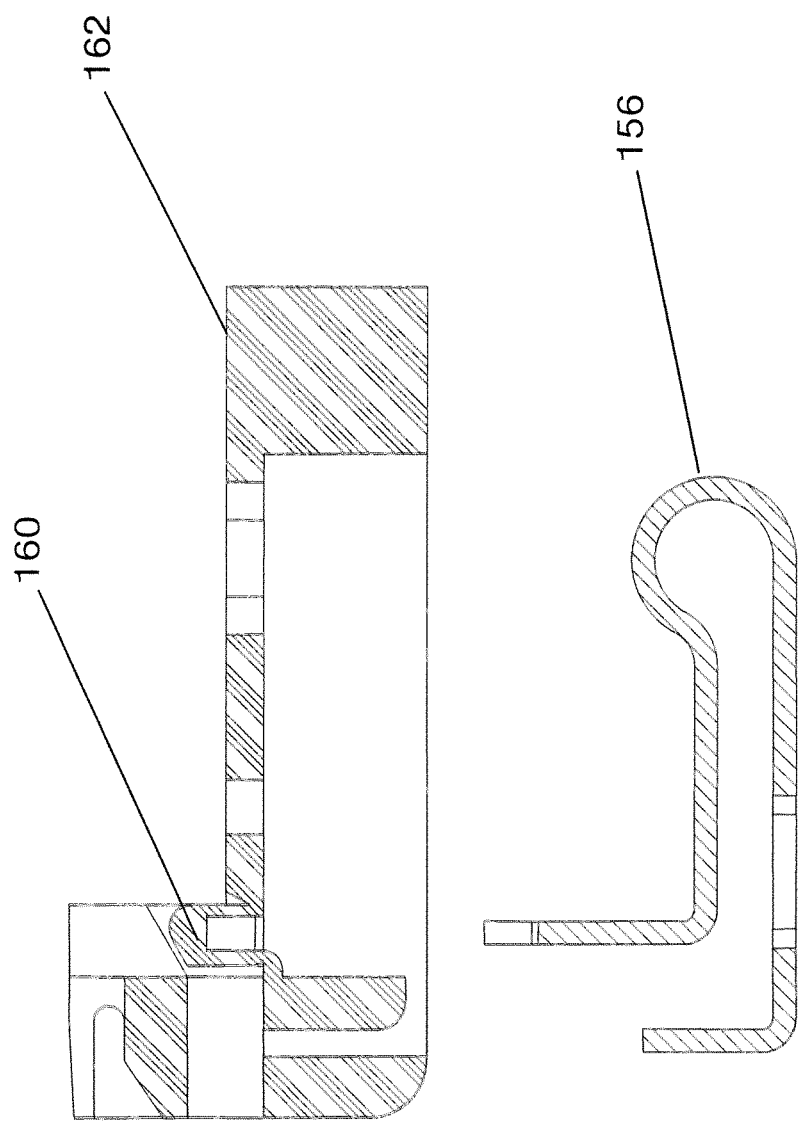
Figure 27:
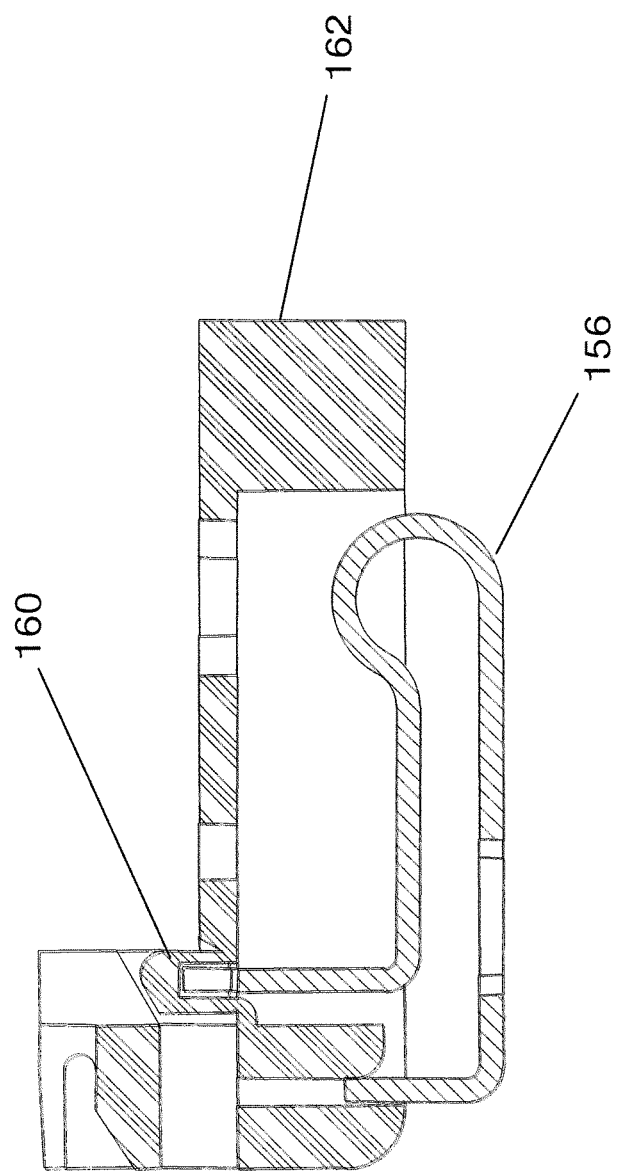
Figure 28:
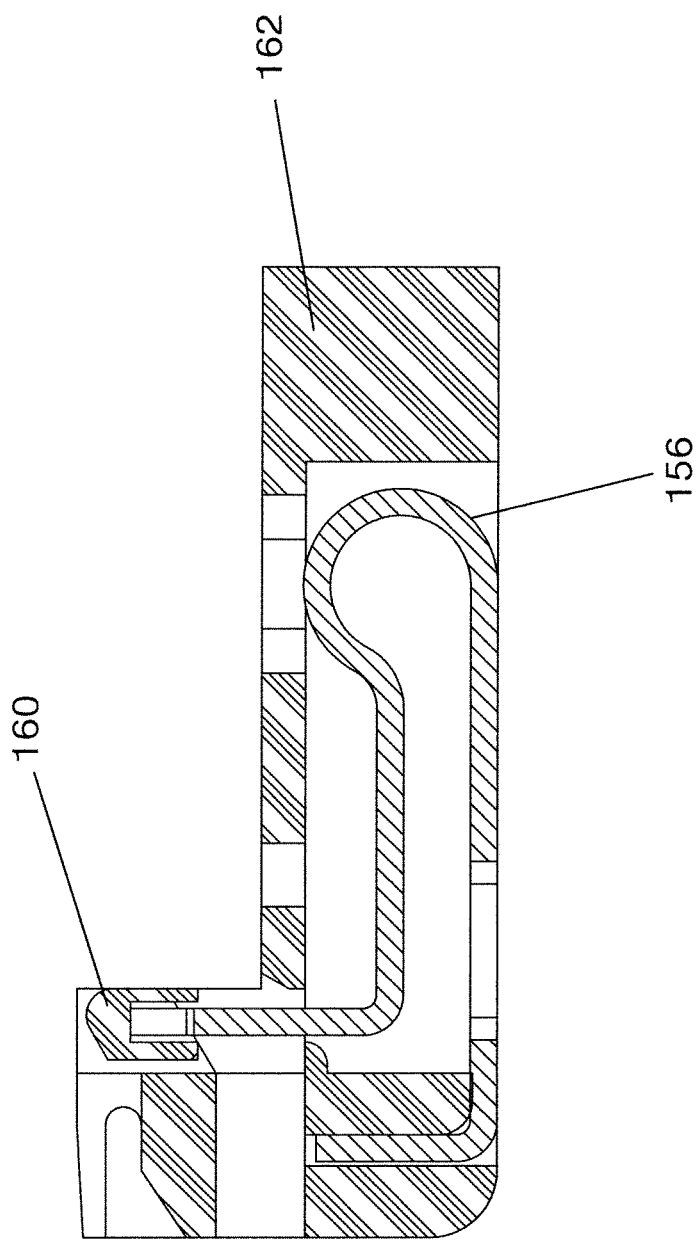

FIG. 25 shows an isometric view of spring 156 being assembled to plastic sled 162. A section view in FIG. 26 shows spring 156 approaching plastic sled 162. Insulator caps 160 are molded into plastic sled 162. In FIG. 27, spring 156 approaches plastic sled 162 where tips of spring 156 engage insulator caps 160. Spring 156 continues driving upward during assembly, breaking the insulator caps 160 free from plastic sled 162 as shown in FIG. 28. By combining the assembly of spring 156 to plastic sled 162, and insulating the PICs 158 from spring 156, into one operation, the micro-insert molding operation is eliminated, reducing the overall cost of the jack.

Figure 29:
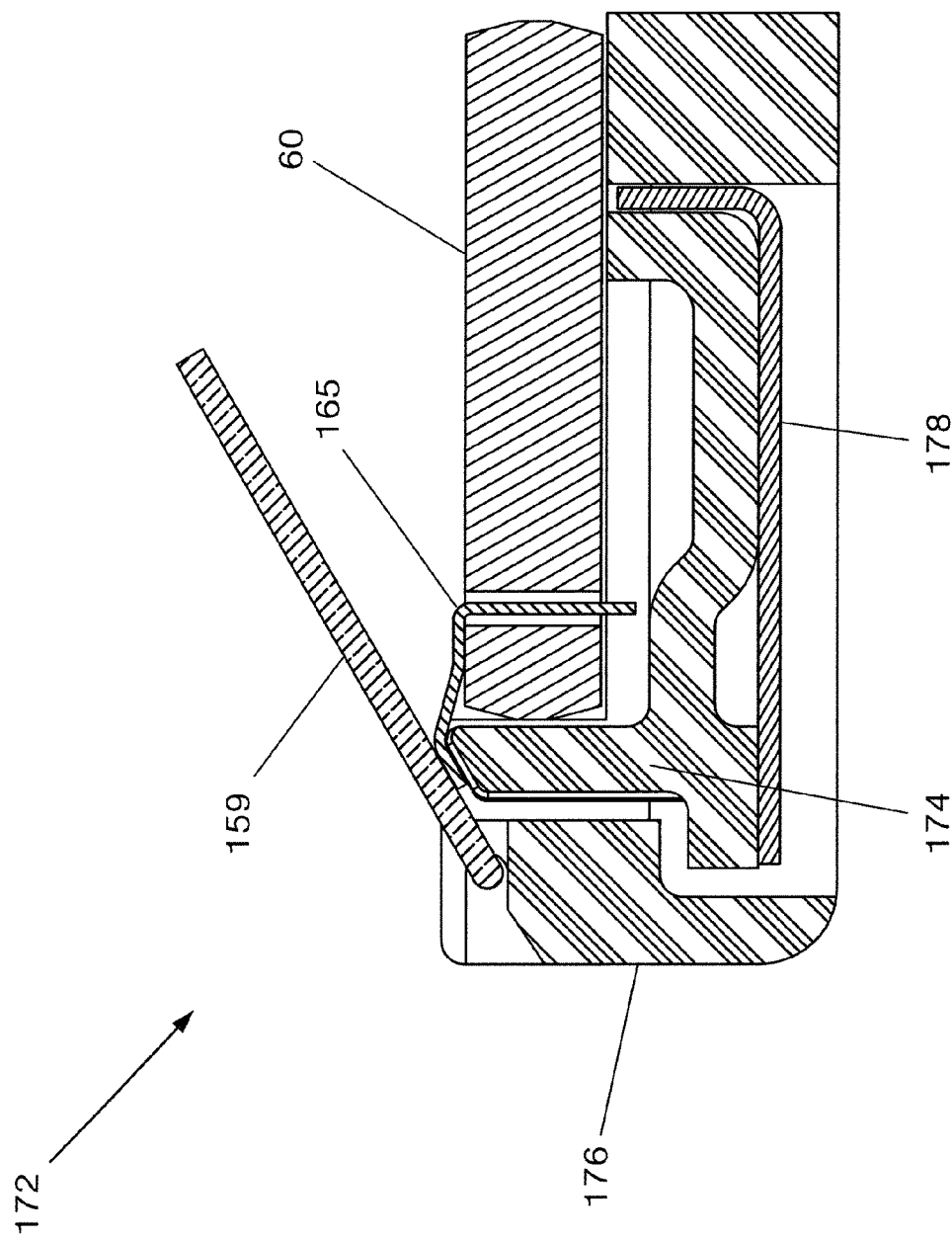

Alternatively, front sled assembly 142 can be modified to eliminate breakaway insulating caps 160. It may be advantageous to use an alternative front sled assembly 172 as shown in FIG. 29. In front sled assembly 172. PIC 159 and PCB to PIC contact 165 are supported by a plastic cantilever 174 molded directly into front sled 176. This allows for the elimination of plastic insulating caps 160. As PIC 159 rotates, plastic cantilever 174 flexes downward. Spring 178 reinforces plastic cantilever 174 and pushes back to provide the necessary force on PIC 159.

Figure 30:
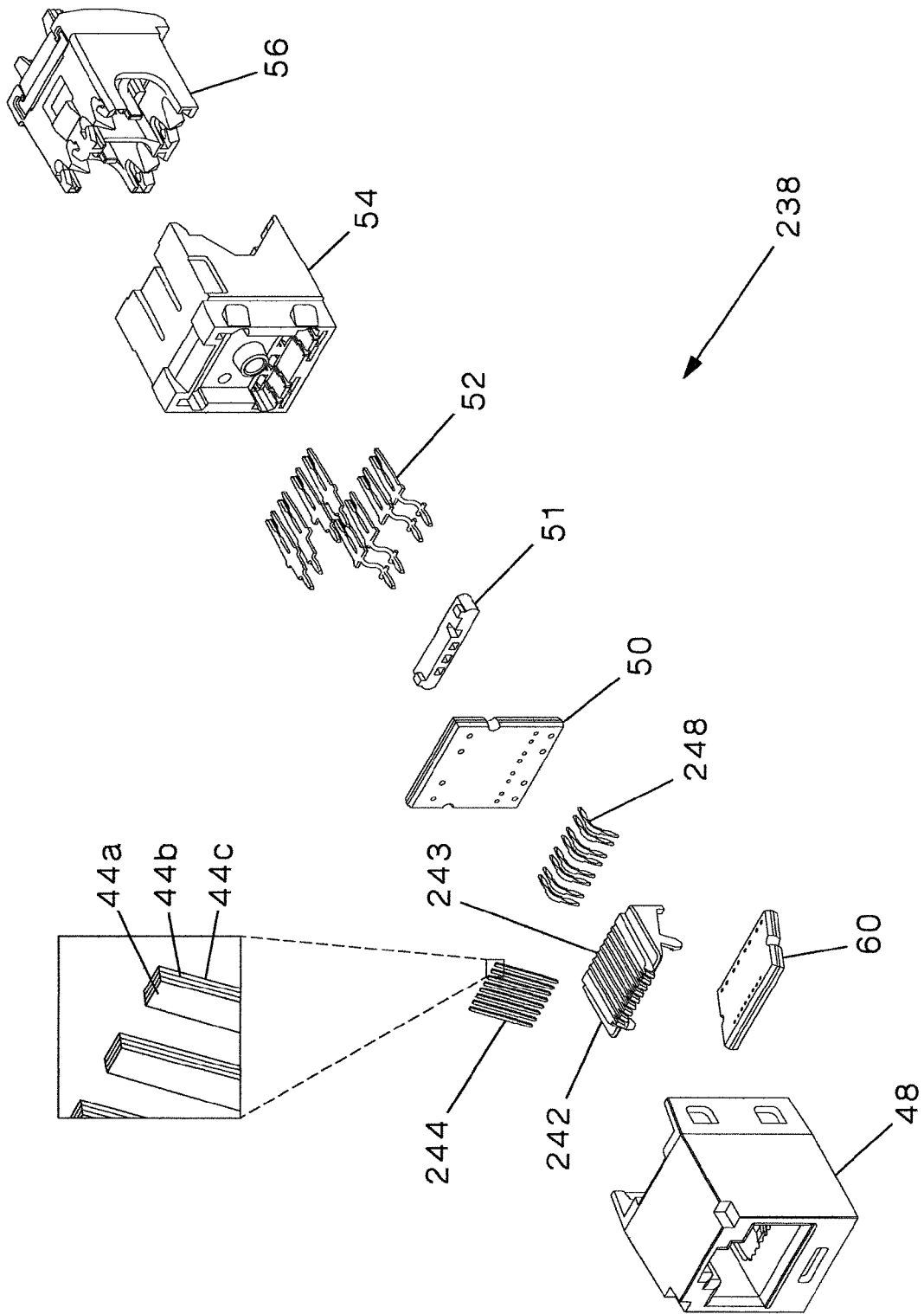
FIGS. 30-32 are various views of another embodiment of a communication jack according to the present invention.
Figure 31:
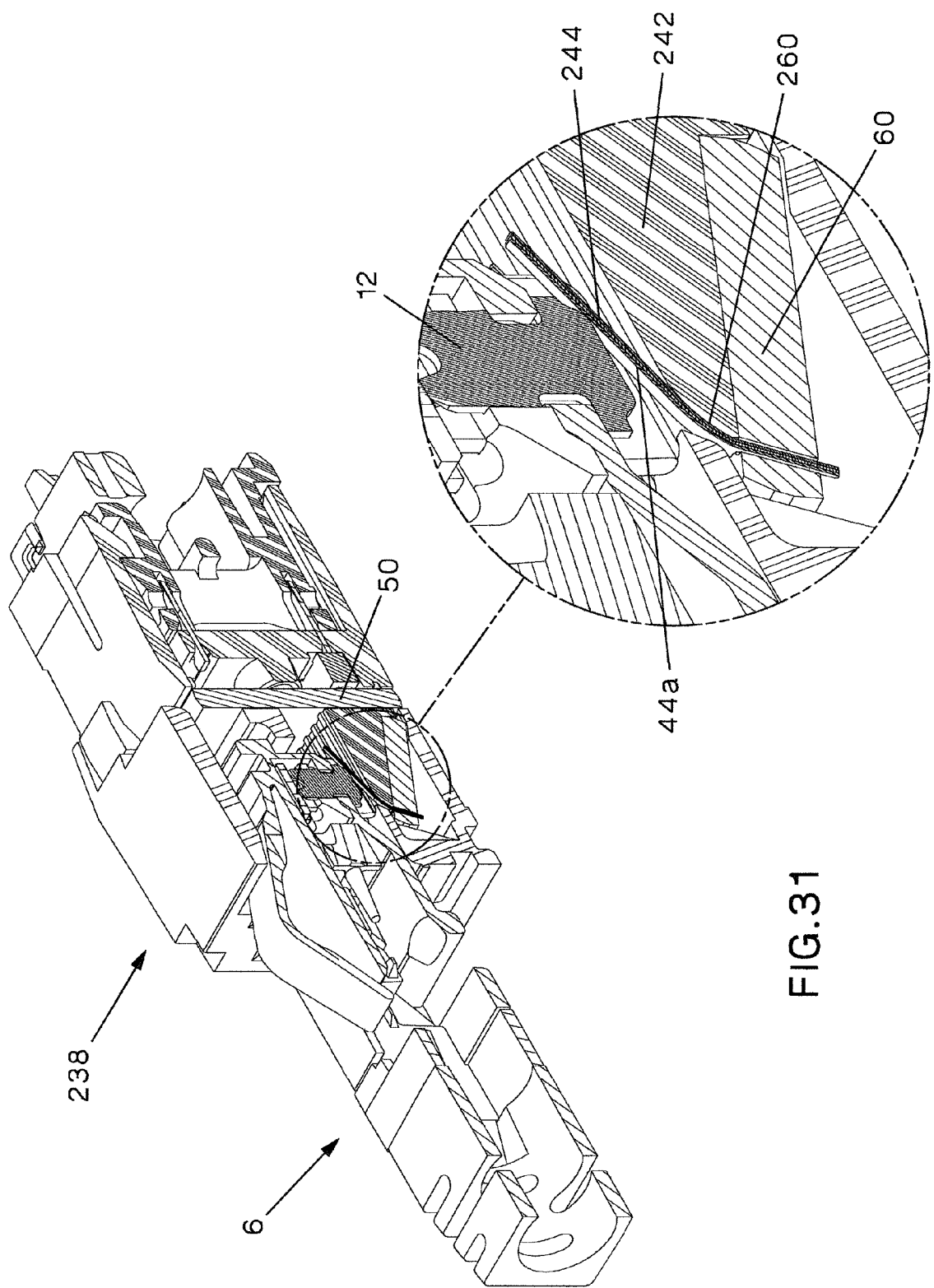
Figure 32:
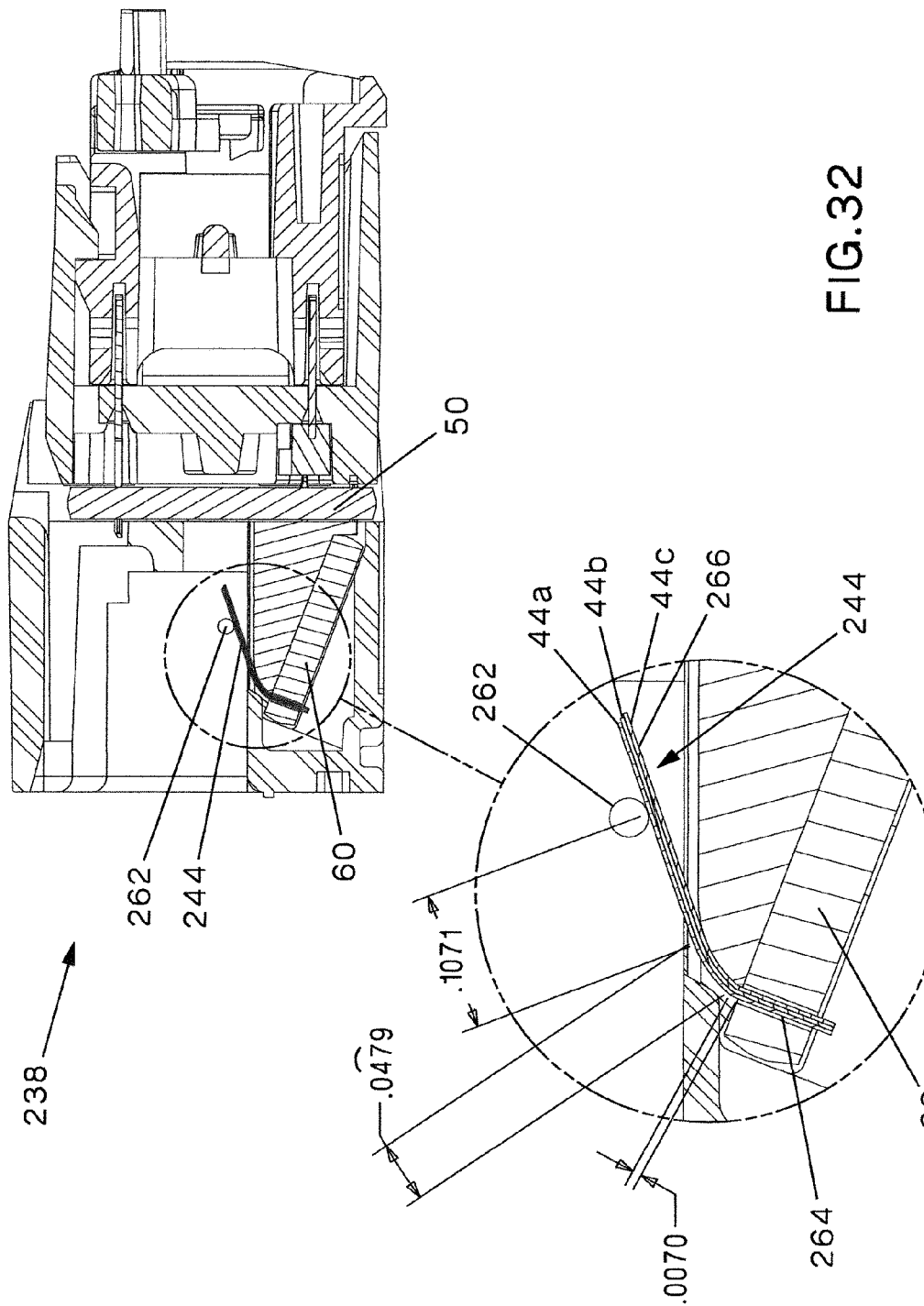
Figure 33:
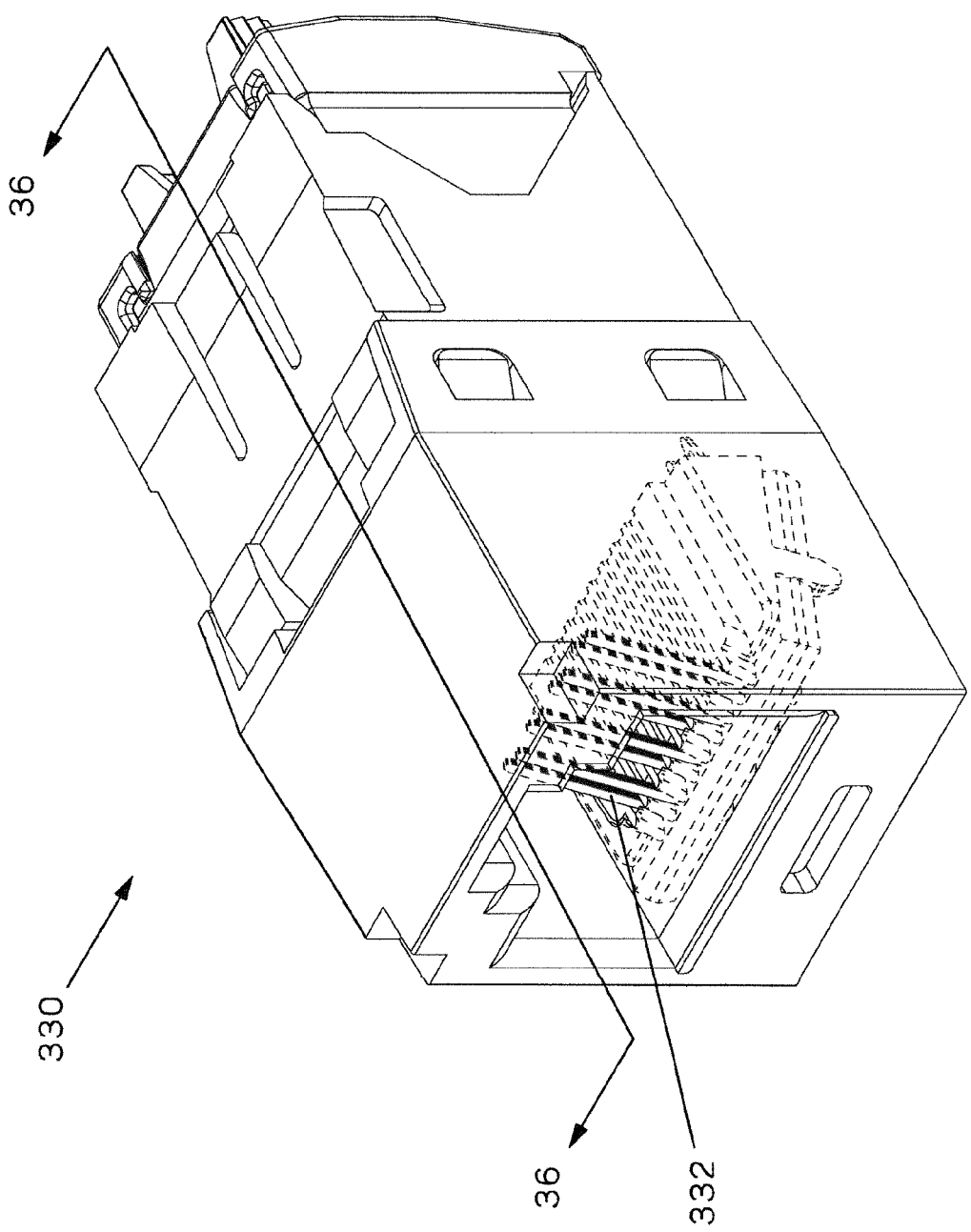
FIGS. 33-36 are various views of another embodiment of a communication jack according to the present invention.

FIGS. 30-32 illustrate another embodiment of the present invention. RJ45 jack 238 (FIG. 30) reduces cost by eliminating the secondary spring component as well as simplifying assembly by eliminating the PIC's plastic overmolded sleeve, and electrical performance is improved by shortening the electrical distance between the plug contact and the first PCB. Furthermore, PIC comb structures are designed in the front sled.

An exploded view of jack 238 is shown in FIG. 30. Jack 238 is comprised of a front housing 48, front sled 242. PICs 244, front PCB 60, PCB to PCB contacts 248, vertical PCB 50, insulation displacing contacts (IDCs) support structure 51, IDCs 52, rear housing 54, and termination cap 56.

Jack 238 of FIGS. 30-32 uses two rigid circuit boards 50, 60. However, jack 238 does not decouple the mechanical spring functionality from the PIC. Instead PICs 244 flex and create the necessary normal force at the interface between the PIC 244 and plug contact 12 to ensure a proper electrical bond. This design is attainable if PICs 244 are fabricated from sufficiently thin layers 44a-44c of material so as not to plastically deform during plug insertion. Thicker materials would experience higher stresses during deflection and would not spring back to its original nominal position, drastically reducing the reliability of the jack. However, a single thin PIC 244 does not provide enough normal force at the interface between PIC 244 and plug contact 12. Therefore multiple thin PIC layers 44a, 44b, and 44c are stacked and the cumulative group provides the necessary normal force. PIC layers 44a, 44b, and 44c do not have to be of the same material. Only PIC layer 44a that engages plug contact 12 needs to be of a material that has high electrical conductivity, such as phosphor-bronze plated with nickel, then plated with gold. PIC layers 44b and 44c can be fabricated from a different material, such as a spring steel to provide the mechanical normal force requirement. The thickness of the individual PICs 44a-44c can be 0.001-0.005 inches, and preferably in the range of 0.002-0.003 inches. Although three layers of individual PICs 44a-44c are shown each PIC 244 can have 2-7 layers, and preferably 3-5 layers.

PICs 244 are not laminated PICs; instead they are free-body layered PICs. Each of the layers of fixed end 264 of PIC 244 (see FIG. 32) are constrained by PCB 60 and a solder joint, or alternatively a press-fit joint. However, each of layers 44a-44c can move relative to each other in free section 266 of PIC 244. PICs 244 are laterally constrained in part by comb 243 on front sled 242.

FIG. 31 shows a section view of an RJ45 plug 6 inserted into jack 238. The plug contact 12 of plug 6 makes electrical contact with PIC 44a of jack 238. As PICs 244 flex down by plug contact 6, a normal force is generated at the interface to ensure proper electrical bond. Front sled 242 is located atop front PCB 60 and is wedge-shaped to control the angle at which PCB 60 sits in the assembly of jack 238. Also, front sled 242 backs up PICs 244 and has bend radius control 260 to ensure proper bending of PICs 244, which will distribute stresses evenly and prevent localized stress concentrations that could lead to material yield.

In addition to simplified assembly, electrical performance benefits can be achieved by using the layered PIC design of jack 238. FIG. 32 shows the electrical distance of PIC 244, which is defined as total signal length from nominal plug contact 262 as defined in IEC 60603-7-1 to front PCB 60. The electrical distance of jack 238 is 0.162". This translates to reduced PIC coupling and improved electrical performance.

FIGS. 33-36 illustrate another embodiment of the present invention. RJ45 jack of FIGS. 33-36 has improved PICs, PIC staggering, and jack housing features to improve the PICs/PIC interface in the jack to make the PICs robust and relatively low cost.

Figure 34:
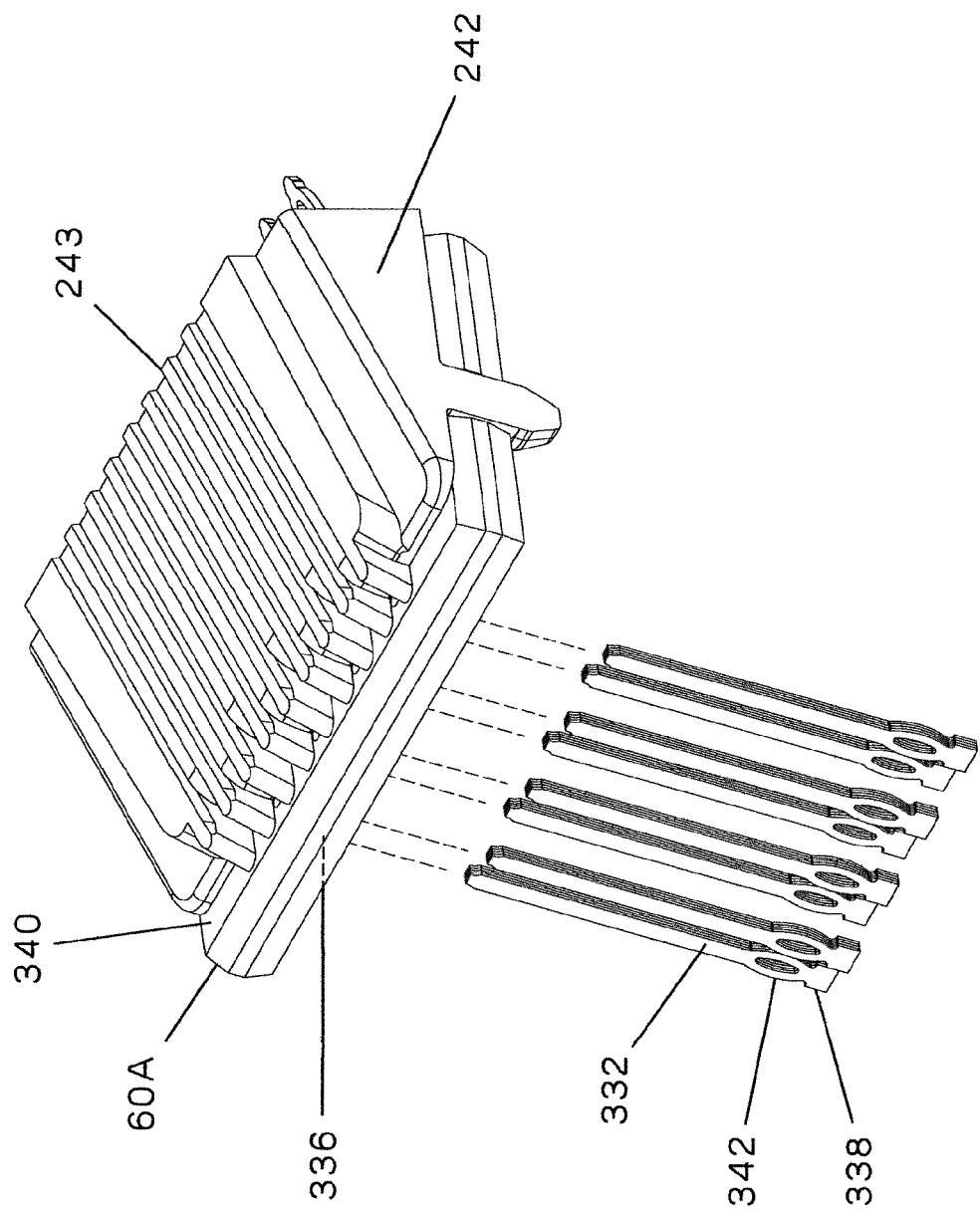

Referring now to FIGS. 33-36, RJ45 jack 330 includes PICs 332 which are inserted into bottom side 336 of PCB 60A as shown into FIG. 34. As with PICs 244, PICs 332 are layered PICs with a contact layer and at least one spring layer. Sled 242 includes comb structure 243 to help constrain PICs 332 when they are depressed by plug 6, as is also shown in FIG. 30. Shoulder features 338 are present on PICs 332 to prevent PICs 332 from traveling too far during insertion or pulling out of top side 340 of PCB 60A during cycling or vibration. Press fit features 342 are located on PICs 332 to create a mechanical friction hold as well as ensure sufficient continuity between PICs 332 and PCB 60A. Press fit features 342 are shown in FIG. 34 with a stamped eye of the needle type of design. PCB 60A can have compensation the same as, or similar to, that previously described for PCB 60.

Figure 35:
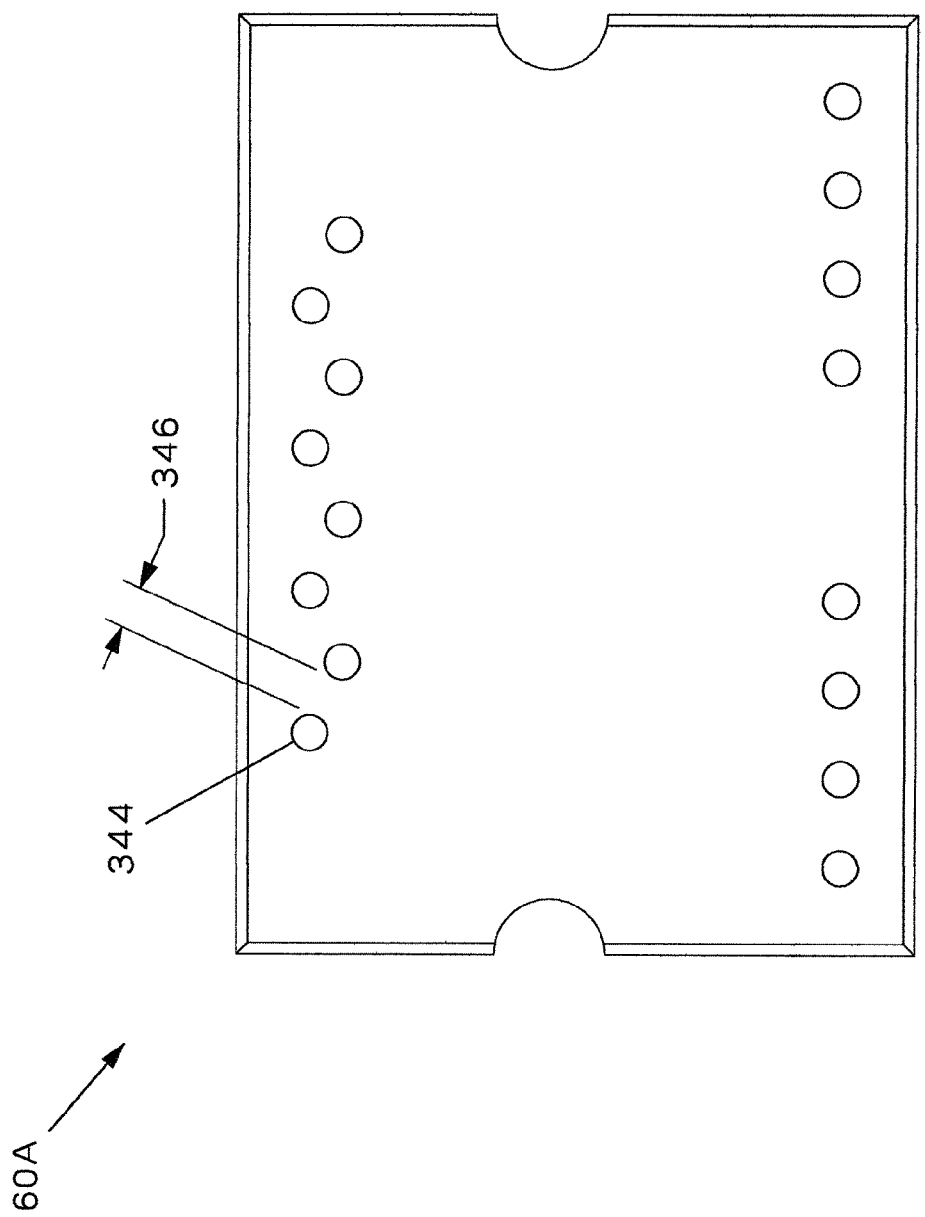

Because PICs 332 are inserted into bottom side 336 of PCB 60A, the width of PICs 332 must be less than the diameter of holes 344. Therefore, to increase the width of PICs 332, holes 344 must also increase in diameter. Increasing PIC 332 width is mechanically and electrically advantageous as it increases PIC 332 stiffness, makes assembly handling easier, and provides lower electrical resistance. As the hole diameter increases, the edges of adjacent holes get closer in proximity unless holes 344 are staggered as shown in FIG. 35. It is important to maintain sufficient separation 346 between hole 344 edges because hi-pot failures will occur if they get too close.

Figure 36:
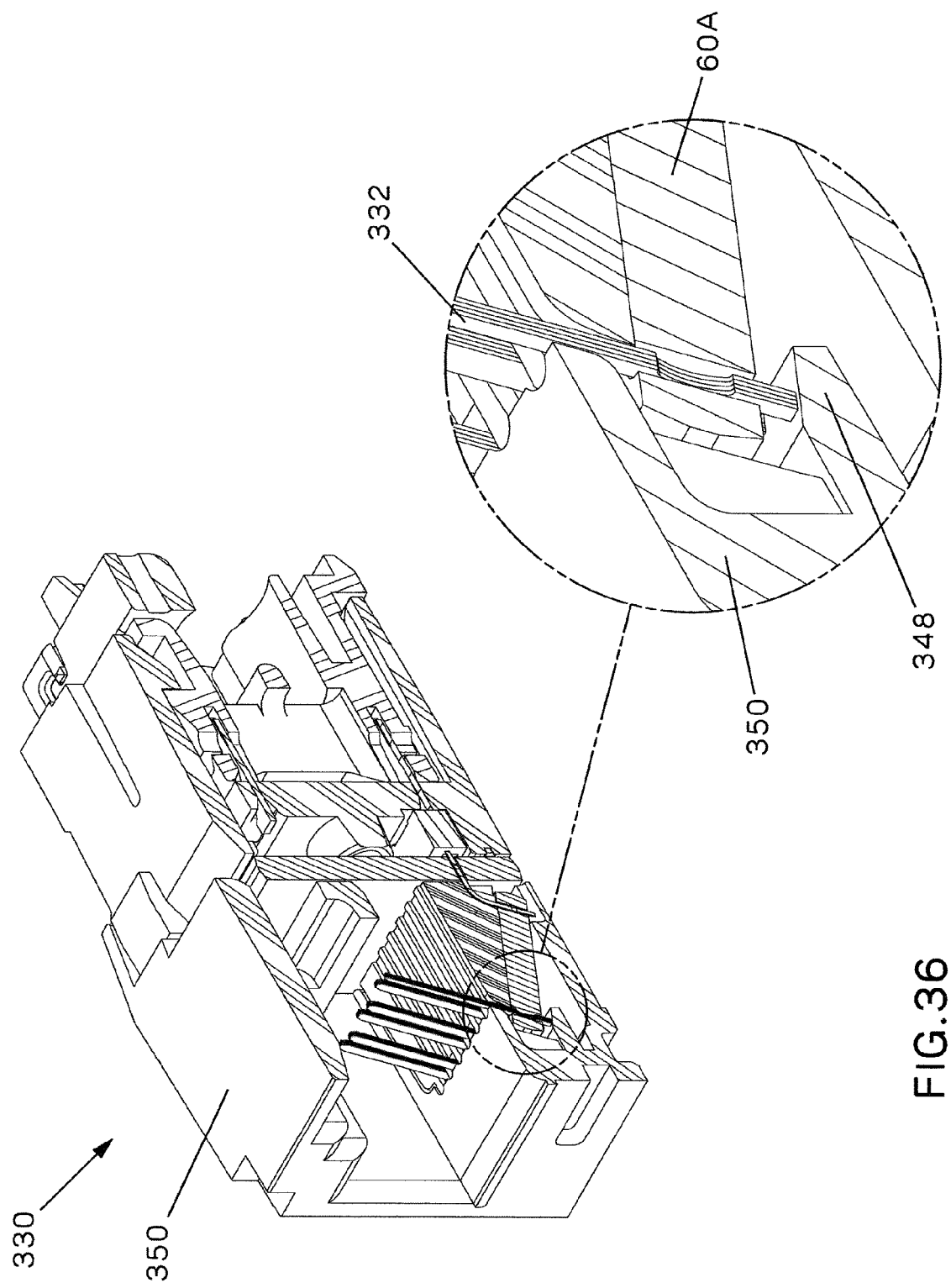

FIG. 36 shows a section view of jack 330. PICs 332 cannot be pulled out of PCB 60A through top side 340 because of shoulder features 338. To eliminate PICs 332 from pulling out of PCB 60A from the bottom, a ledge 348 has been added to front housing 350. Ledge 348 reduces the mechanical frictional requirement of press fit features 342 which increases overall robustness of the interface.

Alternative embodiments of features 342 may include compliant shape made using shearing, forming, or coining operations individually or combined.

Other embodiments of the present invention can include PCB 60A and PCB 50A (see FIGS. 37-43). In this embodiment the present invention uses two unique stack-ups for both the rigid PCB 60A and the rigid PCB 50A. The rigid PCB 60A uses a 4-layer stack-up that contains 2 mil cores on the outer layers. This allows trace routings on all layers giving the engineer more flexibility, in addition to placing the capacitors as close as possible to the plug. Finally, the rigid PCB 50A uses a 2-layer stack-up. The reason a 2-layer stack-up was used is that the vertical board 30 has no capacitors on it. Therefore, it is used to connect the PCB to PCB contacts to the IDCs and a 2-layer board is a cost effective method of doing that. Each of these designs is 0.062" thick, and the rigid PCB 60A stackup is shown in the middle table of FIG. 37 and the vertical board 50A stackup is shown in the bottom table of FIG. 37.

Figure 38:
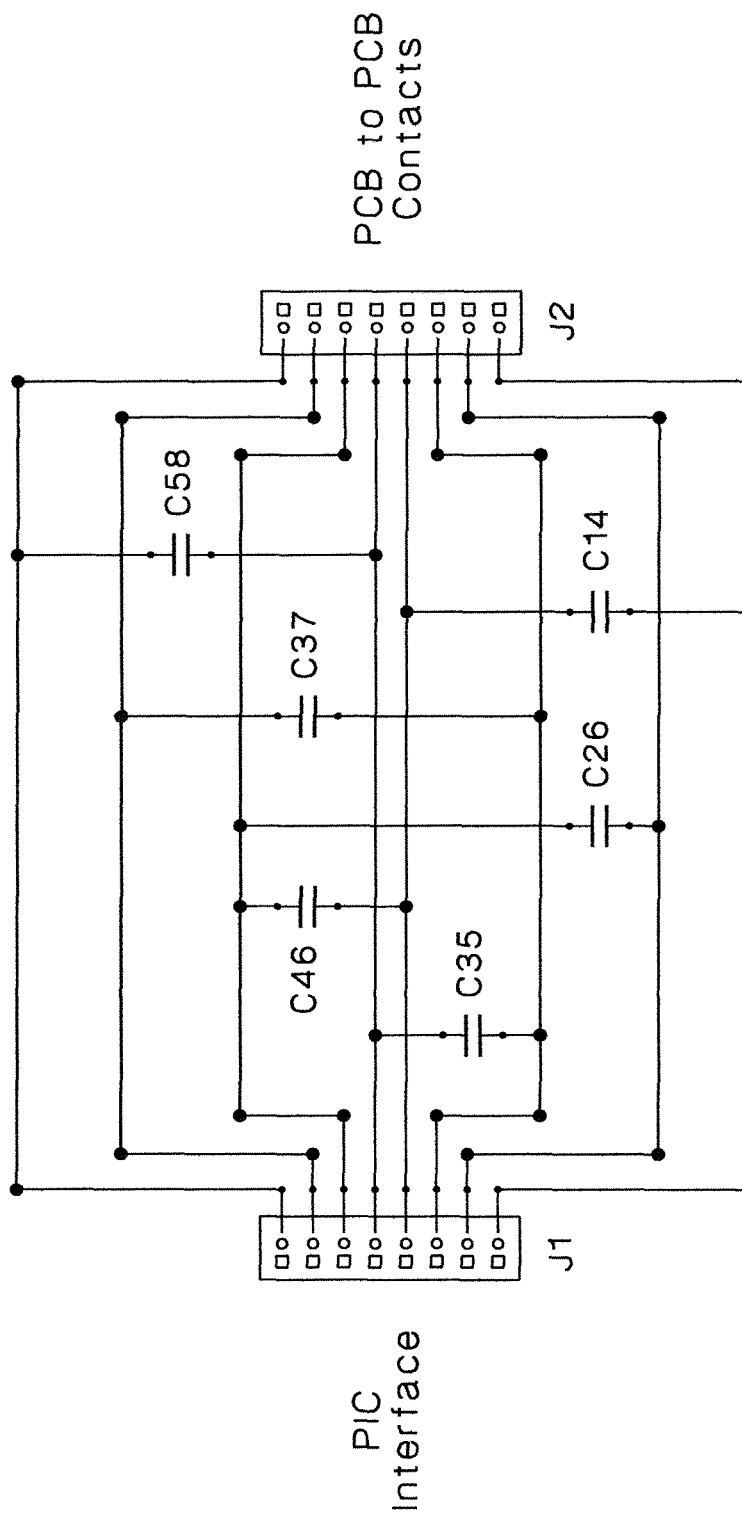
Figure 39:
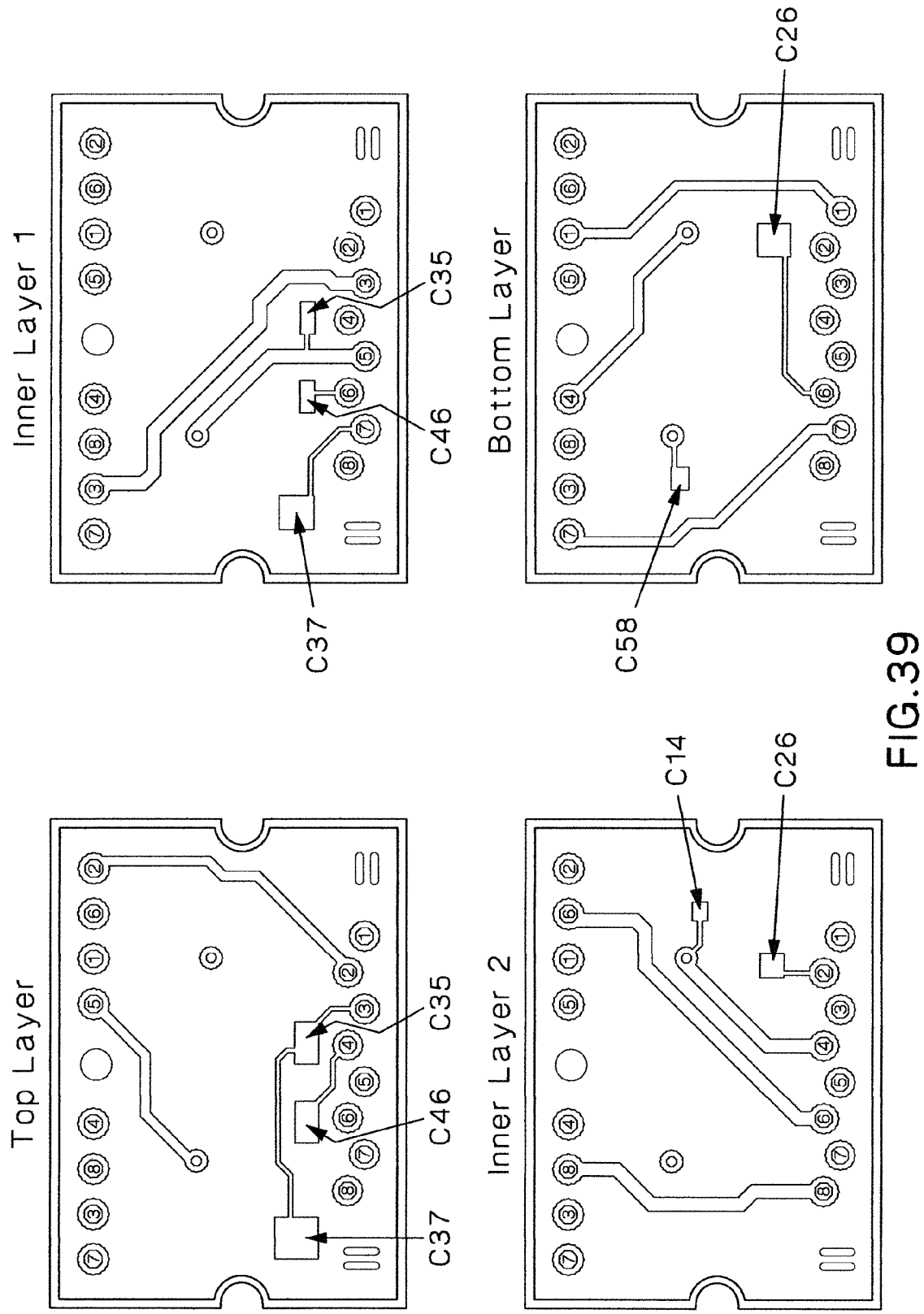
Figure 40:
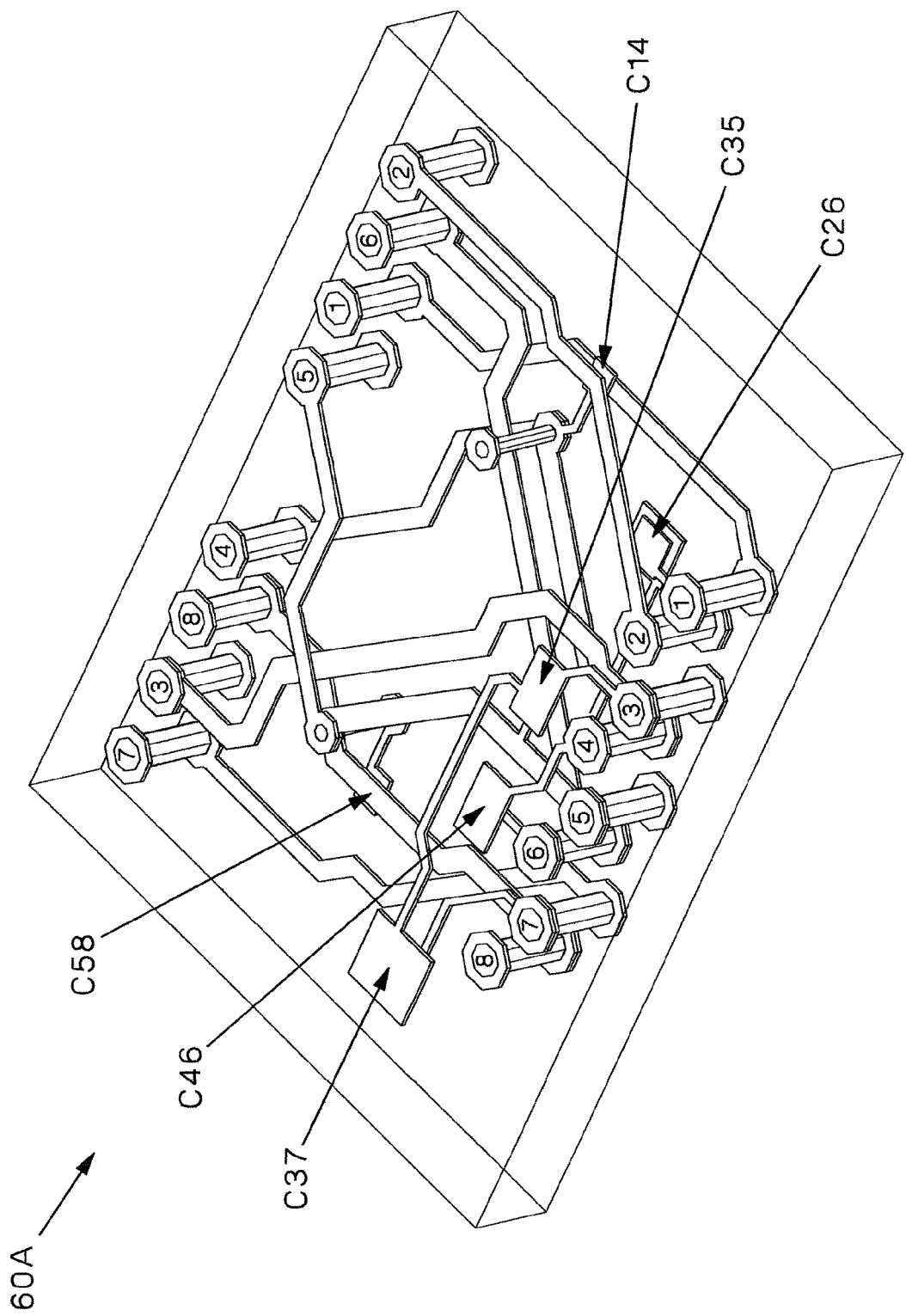

The schematic for rigid PCB 60A is shown in FIG. 38. The artwork for each layer is shown individually in FIG. 39, and together in a single isometric view in FIG. 40. A summary of the compensation on rigid PCB 60A:

1) Crosstalk compensation with a polarity opposite that of the plug for pair combination 45-36 is provided by pad capacitors C35 and C46. The surface area for both pad capacitors is 0.000576 inches$^2$ (±20%), resulting in a capacitance of approximately 0.9 pF.
2) Crosstalk compensation with a polarity opposite that of the plug for pair c combination 36-12 is provided by pad capacitor C26. The surface area for these pad capacitors is 0.000676 inches$^2$ (±20%), resulting in a capacitance of approximately 0.65 pF.
3) Crosstalk compensation with a polarity opposite that of the plug for pair combination 36-78 is provided by pad capacitor C37. The surface area for these pad capacitors is 0.001369 inches$^2$ (±20%), resulting in a capacitance of approximately 1.1 pF.
4) Crosstalk having the opposite polarity of the net crosstalk caused by the plug for pair combination 45-78 is provided by pad capacitor C58 connected between the 5 and 8 PIC vias. The area of pad capacitor C58 is 0.000225 inches$^2$ (±20%), resulting in a capacitance of approximately 0.3 pF.

5) Crosstalk having the opposite polarity of the net crosstalk caused by the plug for pair combination 45-12 is provided by pad capacitor C14 connected between the 1 and 4 PIC vias. The area of pad capacitor C14 is 0.000121 inches$^2$ (±20%), resulting in a capacitance of approximately 0.2 pF.

Figure 41:
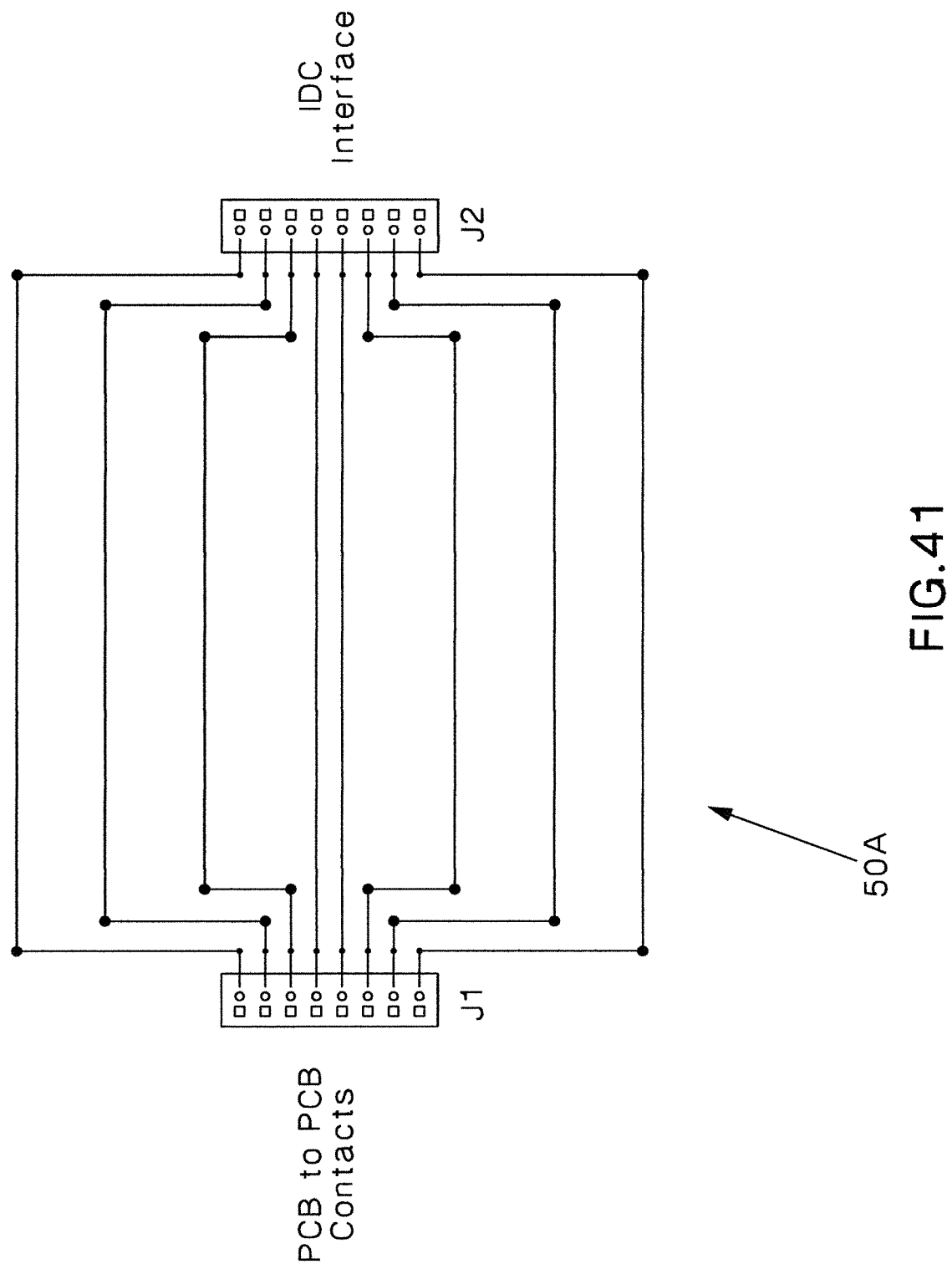
Figure 43:
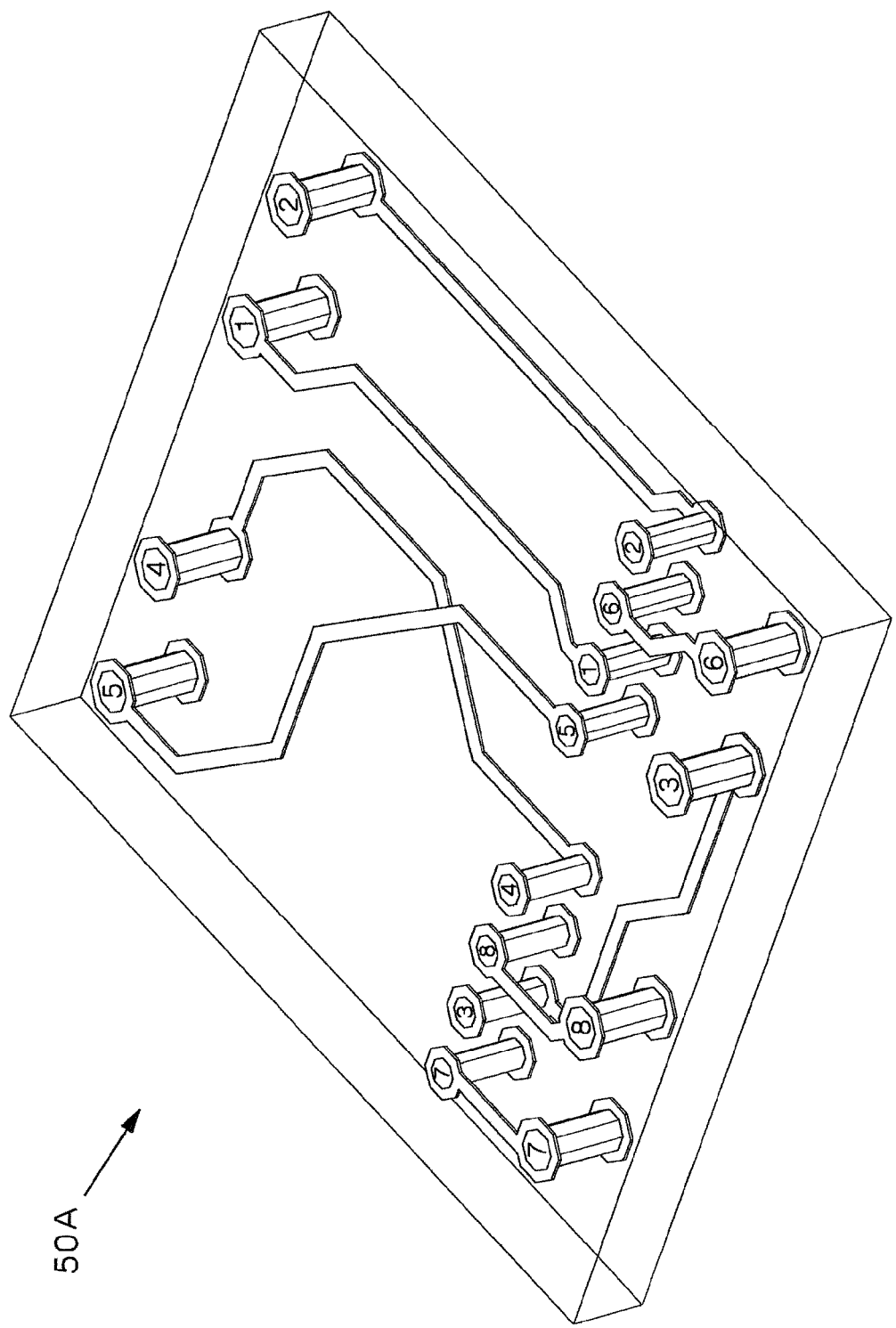

The schematic for the rigid PCB 50A is shown in FIG. 41. The artwork for each layer is shown individually in FIG. 42, and together in a single isometric view in FIG. 43. Rigid PCB 50A is a 2-layer circuit board with no capacitors on it. It serves the purpose of connecting the PCB to PCB contacts 28 to the IDCs 34. The reason a 2-layer circuit board was used is that it offers considerable cost savings over a 4-layer rigid board.

An additional embodiment is to have the same stack-up type for the rigid PCB 60A and rigid PCB 50A (4-layer and 2-layer, respectively), but with a different overall thickness (different than 0.062"). Another embodiment includes a rigid PCB 60A with a different thickness than the overall thickness for rigid PCB 50A. Another embodiment includes a 4-layer stack-up for rigid PCB 50A. The 4-layer stack-up can be from the top table in FIG. 37 or the 4-layer stack-up used by the rigid PCB 60A of the present invention.

Any of the embodiments of PCBs 50A and 60A can replace the PCBs 50 and 60, respectively.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

We claim:

1. A method of manufacturing a communication jack including multiple stages of capacitive coupling, said method comprising the steps of:
    providing a first stage of said capacitive coupling via a first pad capacitor having a pair of first capacitor plates, each of said first capacitor plates having a substantially square shape; and
    providing a second stage of said capacitive coupling via a second pad capacitor having a pair of second capacitor plates, each of said second capacitor plates having a substantially rectangular shape where no two adjacent sides have substantially equal dimensions wherein said first stage of said capacitive coupling and said second stage of said capacitive coupling have opposite polarities, a magnitude of said first stage is greater than a magnitude of said second stage, dimensions of each of said second capacitor plates are selected such that a manufacturing variation from respective target dimensions of said first pad capacitor and said second pad capacitor maintain a net capacitive coupling within said communication jack such that said communication jack meets at least one of a CAT5E, CAT6, CAT6A, CAT7, and CAT7A standards, and wherein each of said first capacitor plates has dimensions X and X, and a surface area A given by $A=X*X$;
    wherein each of said second capacitor plates has dimensions Y and Z, and a surface area B given by $B=Y*Z$;
    wherein said communication jack meets at least one of a CAT5E, CAT6, CAT6A, CAT7, and CAT7A standards;
    wherein $Z=\sqrt{A}\pm\sqrt{(A-B)}$; and
    wherein $Y=\sqrt{A}\mp\sqrt{(A-B)}$.

2. A method of manufacturing a communication jack comprising the steps of:
    providing a jack housing;
    positioning a plurality of plug interface contacts at least partially within said jack housing;
    positioning a plurality of insulation displacement contacts at least partially within said jack housing; and
    providing crosstalk cancellation circuitry between said plurality of plug interface contacts and said plurality of insulation displacement contacts, said crosstalk cancellation circuitry including:
        a first stage of capacitive coupling provided via a first pad capacitor having a pair of first capacitor plates, each of said first capacitor plates having a substantially square shape; and
        a second stage of capacitive coupling provided via a second pad capacitor having a pair of second capacitor plates, each of said second capacitor plates having a substantially rectangular shape where no two adjacent sides have substantially equal dimensions, wherein said first stage of capacitive coupling and said second stage of capacitive coupling have opposite polarities, a magnitude of said first state is greater than a magnitude of said second stage, and each of said first capacitor plates has dimensions X and X, and a surface area A given by $A=X*X$;
    wherein each of said second capacitor plates has dimensions Y and Z, and a surface area B given by $B=Y*Z$;
    wherein A and B are selected such that said communication jack meets at least one of a CAT5E, CAT6, CAT6A, CAT7, and CAT7A standards;
    wherein Z is selected such that $Z=\sqrt{A}\pm\sqrt{(A-B)}$; and
    wherein Y is selected such that $Y=\sqrt{A}\mp\sqrt{(A-B)}$.

3. The method of claim 2, wherein said crosstalk cancellation circuitry is positioned on at least one printed circuit board.

* * * * *